US007354792B2

(12) United States Patent
Carey, III et al.

(10) Patent No.: US 7,354,792 B2
(45) Date of Patent: Apr. 8, 2008

(54) MANUFACTURE OF SILICON-BASED DEVICES HAVING DISORDERED SULFUR-DOPED SURFACE LAYERS

(75) Inventors: James Edward Carey, III, Newton, MA (US); Eric Mazur, Concord, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 153 days.

(21) Appl. No.: 10/950,248

(22) Filed: Sep. 24, 2004

(65) Prior Publication Data

US 2008/0044943 A1 Feb. 21, 2008

Related U.S. Application Data

(63) Continuation-in-part of application No. 10/155,429, filed on May 24, 2002.

(60) Provisional application No. 60/293,590, filed on May 25, 2001.

(51) Int. Cl.
*H01L 21/00* (2006.01)
(52) U.S. Cl. .............................. 438/95; 438/48; 438/57
(58) Field of Classification Search .................. 438/95, 438/48, 57
See application file for complete search history.

(56) References Cited

U.S. PATENT DOCUMENTS

| 4,201,450 | A | 6/1980 | Trapani |
| 4,277,793 | A | 7/1981 | Webb |
| 4,703,996 | A | 11/1987 | Glass et al. |
| 4,965,784 | A | 10/1990 | Land et al. |
| 5,714,404 | A | 2/1998 | Mitlitsky et al. |
| 5,773,820 | A | 6/1998 | Osajda et al. |
| 2003/0029495 | A1 | 2/2003 | Mazur et al. |

OTHER PUBLICATIONS

Crouch et al., "Infrared Absorption By Sulfur-Doped Silicon Formed by Femtosecond Laser Irradiation", *Appl. Phys. A*, 79, 1635-1641 (2004).
Crouch et al., "Comparison Of Structure And Properties Of Femtosecond And Nanosecond Laser-Structure Silicon", *Appl. Phys. Lett.*, 84, 1850-1852 (2004).
Shen et al., "Formation Of Regular Arrays Of Silicon Microspikes By Femtosecond Laser Irradiation Through A Mask", *Appl. Phys. Lett.*, 82, 1715-1717 (2003).

(Continued)

*Primary Examiner*—Long Pham
(74) *Attorney, Agent, or Firm*—Thomas J. Engellenner; Reza Mollaaghababa; Nutter McClennen & Fish, LLP

(57) ABSTRACT

The present invention provides methods of fabricating a radiation-absorbing semiconductor wafer by irradiating at least one surface location of a silicon substrate, e.g., an n-doped crystalline silicon, by a plurality of temporally short laser pulses, e.g., femtosecond pulses, while exposing that location to a substance, e.g., $SF_6$, having an electron-donating constituent so as to generate a substantially disordered surface layer (i.e., a microstructured layer) that incorporates a concentration of that electron-donating constituent, e.g., sulfur. The substrate is also annealed at an elevated temperature and for a duration selected to enhance the charge carrier density in the surface layer. For example, the substrate can be annealed at a temperature in a range of about 700 K to about 900 K.

37 Claims, 16 Drawing Sheets

OTHER PUBLICATIONS

Younkin et al., "Infrared Absorption By Conical Silicon Microstructures Made In A Variety Of Background Gases Using Femtosecond-Laser Pulses", *J. Appl. Phys.*, 93, 2626-2629 (2003).

Wu et al., "Visible Luminescence From Silicon Surfaces Microstructured In Air", *Appl. Phys. Lett.*, 81, 1999-2001 (2002).

Wu et al., "Near-Unity Below-Band Gap Absorption By Microstructured Silicon", *Appl. Phys. Lett.*, 78, 1850-1852 (2001).

Her et al., "Femtosecond Laser-Induced Formation Of Spikes On Silicon", *Appl. Phys. A*, 70, 383-385 (2000).

Her et al., "Microstructuring Of Silicon With Femtosecond Laser Pulses", *Appl. Phys. Lett.*, 73, 1673-1675 (1998).

Carey et al., "High Sensitivity Silicon-Based VIS/NIR Photodetectors", CLEO 2004 (San Francisco, CA, 2004) 1-2.

Serpengüzel et al., "Temperature Dependence Of Photoluminescence In Non-Crystalline Silicon", Photonics West (San Jose, CA, 2004) 454-462.

Carey et al., "Femtosecond Laser-Assisted Microstructuring Of Silicon For Novel Detector, Sensing And Display Technologies", LEOS Oct. 26, 2003 (Tuscon, AR, 2003) 481-482.

Carey et al., "Femtosecond Laser-Assisted Microstructuring Of Silicon For Novel Detector, Sensing And Display Technologies", LEOS 2002 (Glasgow, Scotland, 2002) 97-98.

Younkin et al., "Infrared Absorption By Conical Silicon Microstructures Made In A Variety Of Background Gases Using Femtosecond-Laser Pulses", CLEO 2001 (Baltimore, MD, 2001) 556-556.

Carey et al., "Field Emission From Silicon Microstructures Formed By Femtosecond Laser Assisted Etching", CLEO 2001 (Baltimore, MD, 2001) 555-556.

Carey et al., "Fabrication Of Micrometer-Sized Conical Field Emitters Using Femtosecond Laser-Assisted Etching Of Silicon", International Vacuum Microelectronics Conference 2001 (Davis, CA, 2001) 75-76.

Her et al., "Novel Conical Microstructures Created In Silicon With Femtosecond Laser Pulses", CLEO 1998 (San Francisco, CA, 1998) 511-512.

Carey et al., "Femtosecond-Laser-Assisted Microstructuring Of Silicon Surfaces", *Optics and Photonics News*, 14, 32-36 (2003).

Younkin, "Surface Studies And Microstructure Fabrication Using Femtosecond Laser Pulses", Ph.D. Thesis, Harvard University, 2001, 118 pages.

Wu, "Femtosecond Laser-Gas-Solid Interactions", Ph.D. Thesis, Harvard University, 2000, 135 pages.

Sanchez et al., "Dynamics Of The Hydrodynamical Growth Of Columns On Silicon Exposed To ArF Excimer-Laser Irradiation", *Appl. Phys. A*, 66, 83-86 (1998).

Sanchez et al., "Whiskerlike Structure Growth On Silicon Exposed To ArF Excimer Laser Irradiation", *Appl. Phys. Lett.*, 69 (5), 620-622 (1996).

Pedraza et al., "Surface Nanostructuring Of Silicon", *Appl. Phys. A*, 77, 277-284 (2003).

Fowlkes et al., "Surface Microstructuring And Long-Range Ordering Of Silicon Nanoparticles", *Appl. Phys. Lett.*, 80 (20), 3799-3801 (2002).

Dolgaev et al., "Formation Of Conical Microstructures Upon Laser Evaporation Of Solids", *Appl. Phys. A*, 73, 177-181 (2001).

Pedraza et al., "Silicon Microcolumn Arrays Grown By Nanosecond Pulsed-Excimer Laser Irradiation", *Appl. Phys. Lett.*, 74 (16), 2322-2324 (1999).

Hu et al., "Solar Cells from Basic to Advanced Systems," McGraw Hill Book Co., NY 1983, p. 39.

Solar Energy Research Institute, "Basic Photovoltaic Principles and Methods," Van Nostrand Reinhold Co., NY 1984, pp. 45-47 and 138-142.

US 7,354,792 B2

MANUFACTURE OF SILICON-BASED DEVICES HAVING DISORDERED SULFUR-DOPED SURFACE LAYERS

RELATED APPLICATIONS

The present application is a continuation-in-part (CIP) of co-pending patent application entitled "Systems and Methods for Light Absorption and Field Emission Using Microstructured Silicon," filed on May 24, 2002, and having a Ser. No. 10/155,429, which is herein incorporated by reference in its entirety.

The present application is also related to a co-pending patent application entitled "Silicon-Based Visible and Near-Infrared Optoelectric Devices" filed concurrently with the present application, and herein incorporated by reference.

FEDERALLY SPONSORED RESEARCH

The invention was made with Government support under contract DE-FC36-016011051 awarded by Department of Energy (DOE). The Government has certain rights in the invention.

BACKGROUND OF THE INVENTION

The present invention relates generally to methods for fabricating radiation-absorbing semiconductor wafers, and more particularly, to methods for fabricating silicon wafers that can absorb radiation and exhibit diodic current-voltage characteristics.

Modern semiconductor circuits are predominantly based on silicon, which can be readily procured at a lower cost than any other semiconductor and can be easily oxidized. Further, a band gap of 1.05 eV renders silicon suitable for detection of visible light and conversion of sunlight into electricity. Silicon, however, has several shortcomings. For example, it is an indirect band-gap material, and hence it is a relatively poor light emitter. In addition, silicon is not particularly suitable for use in detecting radiation having long wavelengths, such as, infrared radiation employed for telecommunications. Although other semiconductor materials are available that can detect long wavelength radiation better than silicon, they are generally more costly and cannot be readily integrated in optoelectronic circuits that are primarily silicon-based.

Hence, there is a need for silicon-based semiconductor structures and wafers with enhanced radiation-absorbing properties, particularly in wavelengths beyond the band-gap of crystalline silicon. There is also a need for such wafers that can be utilized in fabricating photodetectors that exhibit enhanced responsivity in detecting radiation over a wide wavelength range. Further, there is a need for methods of manufacturing such silicon-based wafers.

SUMMARY OF THE INVENTION

In one aspect, the present invention provides a method of fabricating a radiation-absorbing semiconductor wafer by irradiating at least one surface location of a silicon substrate, e.g., a crystalline silicon, with a plurality of temporally short laser pulses while exposing that location to a substance having an electron-donating constituent so as to generate a substantially disordered surface layer that incorporates a desired concentration of the electron-donating constituent, e.g., a concentration in a range of about 0.5 atom percent to about 5 atom percent, or from about 0.5 atom percent to about 1 atom percent. The substrate is preferably annealed at an elevated temperature and for a duration selected to enhance charge carrier density, e.g., electron carrier density, in the disordered surface layer.

In a related aspect, an annealing temperature and duration can be selected to cause re-arrangement of atomic bonds in the surface layer so as to increase the concentration of free electrons in the surface layer. Further, the annealing temperature and duration can be selected to cause the surface layer to form a diode junction, e.g., a p-n junction, with the underlying silicon substrate. The term "diode junction" is known in the art and generally refers to a junction that can exhibit current rectification (e.g., a junction that exhibits drastically different conductivities in one bias direction relative to the other). Moreover, the annealing temperature and duration can be selected such that the annealed substrate would exhibit a responsivity in a range of about 1 Ampere/Watt (A/W) to about 200 A/W, or preferably in a range of about 10 A/W to about 200 A/W, upon exposure of the surface layer to visible radiation having wavelengths in a range of about 250 nm to about 1050 nm and application of a reverse bias in a range of about 0.1 V to about 15 V, or about 0.5 to about 15 V, to the substrate. Further, the annealing temperature and duration can be selected such that the annealed substrate will exhibit a responsivity in a range of about 0.1 Ampere/Watt (A/W) to about 100 A/W upon exposure of the surface layer to visible radiation having at least a wavelength in a range of about 1050 nm to about 3500 nm and application of a reverse bias in a range of about 0.1 V to about 15 V to the substrate.

In a related aspect, the laser pulses irradiating the substrate's surface have pulse widths in a range of about a few nanoseconds to about 10 femtoseconds, and more preferably in a range of about 50 to about 500 femtoseconds. The laser pulse fluences can range from about 1 $kJ/m^2$ to about 30 $kJ/m^2$, or from about 3 $kJ/m^2$ to about 15 $kJ/m^2$, or from about 3 to about 8 $kJ/m^2$. The annealing temperature can be in a range of about 500 K to about 1100 K, preferably in a range of about 500 K to about 900 K, and more preferably in a range of about 700 K to about 900 K, and the annealing duration can be from about a few seconds to about a few hours.

In another aspect, the substance containing an electron-donating constituent can be a gas, a fluid or a solid. Some examples of such substances include, without limitation, $SF_6$, $H_2S$, $Cl_2$, and $N_2$. For example, when $SF_6$ is utilized, the exposure of the silicon surface to the laser pulses generates sulfur inclusions in a surface layer of the substrate. The silicon substrate is preferably n-doped, but it can also be p-doped. The substrate's bulk doping level can be in a range of about $10^{11}$ to about $10^{18}$ $cm^{-3}$.

In another aspect, the present invention provides a method of fabricating a radiation-absorbing semiconductor structure that calls for irradiating each of a plurality of locations on a surface of a silicon substrate with one or more femtosecond laser pulses while exposing the surface to a sulfur-containing substance so as to generate a plurality of sulfur inclusions in a surface layer of the substrate. The substrate is annealed at a temperature in a range of about 500 K to about 1100 K for a time duration in a range of about a few seconds to about a few hours. The annealing step can be performed subsequent to, or simultaneously, with irradiation of the substrate's surface with laser pulses. Further, the annealing step can be performed in an inert atmosphere or in vacuum (i.e., a low-pressure atmosphere).

In a related aspect, the light emitted in each laser pulse can have a narrow spectrum and a central wavelength in a range of about 200 nm to about 1200 nm (e.g., 800 nm or 1064 nm), fluences in a range of about 1 kJ/m$^2$ to about 30 kJ/m$^2$, and more preferably in a range of about 1 kJ/m$^2$ to about 10 kJ/m$^2$, and a repetition rate in a range of about 1 kHz to about 50 MHz, or in a range of about 1 kHz to about 1 MHz.

In another aspect, the invention provides a method of fabricating a semiconductor wafer by irradiating a plurality of locations on a surface of a silicon substrate with one or more laser pulses having pulse widths in a range of about 50 to about 500 femtoseconds while exposing the surface to a substance having an electron-donating constituent so as to generate a microstructured surface comprising inclusions that incorporate the electron-donating constituent. The laser pulses can be directed at the substrate in a direction forming a selected angle relative to the substrate's surface, e.g., normal to the surface. The substrate is annealed at an elevated temperature in range of about 500 K to about 1100 K for a selected time duration, e.g., in a range of about a few seconds to about a few hours. In certain applications, the annealing temperature can be between about 500 K and 1000 K, and more preferably between 575 K and 875 K.

In another aspect, the invention provides a method of fabricating a semiconductor wafer by irradiating at least one location on a surface of a silicon substrate with temporally short laser pulses, e.g., femtosecond pulses, while exposing the surface to a substance having an electron-donating constituent so as to generate a microstructured surface layer having inclusions containing the electron-donating constituent. The substrate can be annealed, either following the laser irradiation or simultaneous therewith, at a temperature and for a duration selected to enhance the responsivity of the microstructured substrate to electromagnetic radiation having at least one wavelength in a range of about 250 nm to about 1100 nm by a factor of about 10, or preferably about 20, or more preferably about 100, relative to a similarly microstructed substrate but without annealing. The responsivity can be measured upon application of a reverse bias voltage in a range of about 0.5 V to about 15 V to the substrate. A suitable annealing temperature for effecting such enhancement of the wafer's responsivity lies in a range of about 600 K to about 900 K, and more preferably in a range of about 700 K to about 900 K, and a suitable annealing duration lies in a range of about a few seconds to about a few hours.

Further understanding of the invention can be obtained by reference to the following detailed description in conjunction with the associated drawings, which are briefly described below.

DETAILED DESCRIPTION

Figure 1:
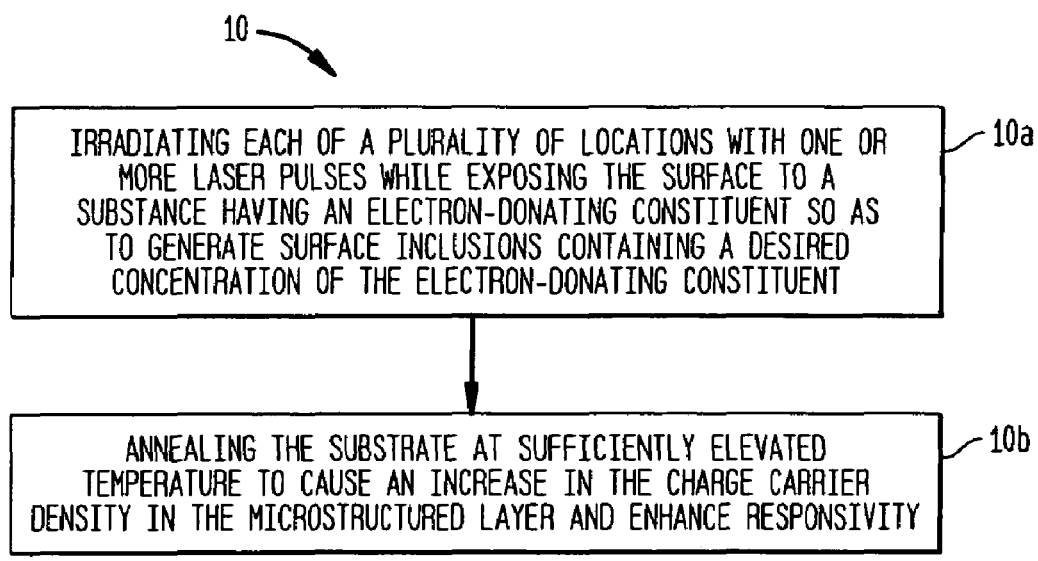
FIG. 1 is a flow chart depicting various steps in an exemplary embodiment for generating a microstructured silicon wafer suitable for absorbing radiation.

With reference to a flow chart 10 of FIG. 1, in one aspect, the present invention provides a method of fabricating a radiation-absorbing semiconductor structure in which, in an initial step 10a, each of a plurality of locations on a surface of a silicon substrate is irradiated with one or more laser pulses while exposing the surface to a substance having an electron-donating constituent so as to generate surface inclusions containing a concentration of the electron-donating constituent. The laser pulses can have a central wavelength in a range of about 200 nm to about 1200 nm, and a pulse width in a range of about tens of femtoseconds to about hundreds of nanometers. Preferably, the laser pulse widths are in a range of about 50 femtoseconds to about 50 picoseconds. More preferably, the laser pulse widths are in the range of about 50 to 500 femtoseconds. The number of laser pulses irradiating the silicon surface can be in a range of about 2 to about 2000, and more preferably, in a range of about 20 to about 500. Further, the repetition rate of the pulses can be selected to be in a range of about 1 kHz to about 50 MHz, or in a range of about 1 kHz to about 1 MHz. Moreover, the fluence of each laser pulse can be in a range of about 1 kJ/m$^2$ to about 12 kJ/m$^2$, and more preferably in a range of about 3 kJ/m$^2$ to about 8 kJ/m$^2$.

While in some embodiments, the electron donating constituent is a fluid (gas or liquid), in other embodiments it can be a solid deposited over the silicon surface exposed to laser pulses. By way of example, in some embodiments, the silicon surface can be exposed to a sulfur-containing gas (e.g., SF$_6$ or H$_2$S) while irradiated with the laser pulses. In some other embodiments, Cl$_2$ or N$_2$ is employed as the electron-donating substance with which the silicon surface is in contact during laser irradiation. In yet other embodiments, selenium or tellurium can be employed. Without any loss of generality, in the following discussion, it is assumed that SF$_6$ is employed as the substance containing an electron-donating constituent, and that the irradiating pulses have femtosecond pulse widths, unless otherwise indicated. However, it should be clear to those having ordinary skill in the art that various embodiments of the invention described below can also be practiced with other fluids or solids and laser pulses having other pulse widths, such as those listed above.

In some embodiments, the silicon substrate is p-doped (e.g., doped with Boron) with a doping level in a range of about $10^{11}$ to about $10^{18}$. In other embodiments, the silicon substrate is slightly n-doped (e.g., doped with Phosphorus) with a doping level in a range of about $10^{11}$ to about $10^{18}$, and preferably in a range of about $10^{12}$ to about $10^{15}$. The substrate thickness is not typically a critical parameter, and can be in a range of about 2 microns to about 1000 microns. The substrate can have an electrical resistivity in a range of about 0.001 ohm-m to about 10 ohm-m.

Figure 2:
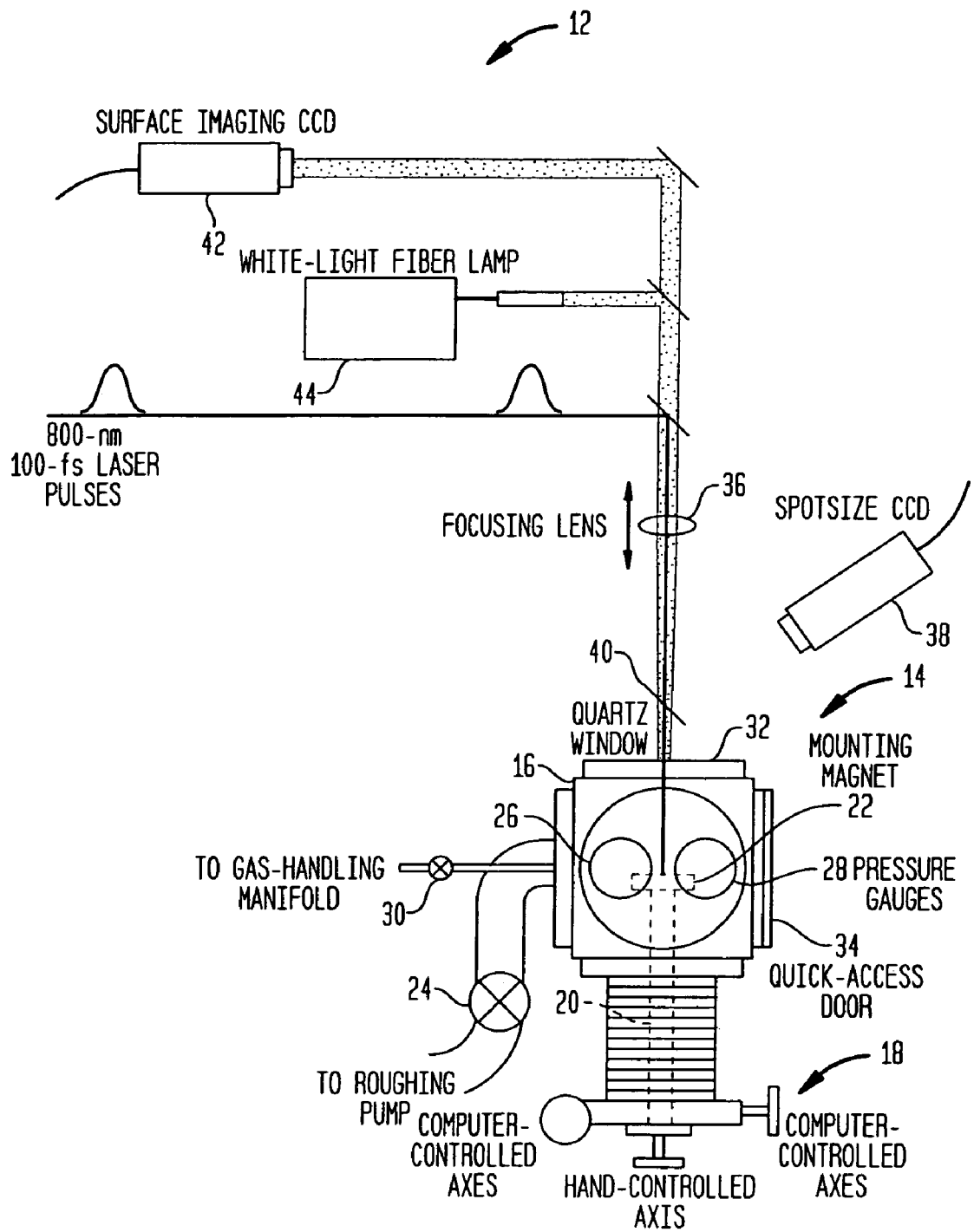
FIG. 2 is a schematic diagram of an exemplary apparatus for microstructuring silicon wafers in accordance with one aspect of the invention.

FIG. 2 schematically depicts an exemplary apparatus 12 that can be utilized for irradiating a silicon sample with a plurality of femtosecond pulses. The apparatus 12 includes a sample processing chamber 14 that comprises a stainless steel cube 16 with Conflat flange connections on each of its six sides. A three-axis, precision motion controller 18 is attached to the back side of the cube. This controller contains two orthogonal micrometer precision axes driven by computer controlled motors. The third axis is hand-controlled with about 1 mil precision. The controller can translate a one-inch diameter stainless steel rod 20 that supports a 2-inch diameter mounting magnet 22 in the center of the cube to which a magnetizable sample holder can be mounted. A two-stage roughing pump 24 is coupled to the cube to evacuate the chamber to a base pressure of approximately $10^{-3}$ torr. Two pressure gauges 26 and 28 are employed to monitor the chamber's pressure. A leak valve 30 and a gas-handling manifold (not shown) allow introduction of gases of interest into the chamber. An optical grade, 4.5 inch quartz window 32 is attached to the front of the chamber for providing laser access. Further, a quick-access viewport door 34 allows rapid loading and removal of samples as well as safe viewing of the sample during microstructuring.

In this exemplary apparatus, a regeneratively amplified, femtosecond Ti:Sapphire laser system (not shown) provides approximately 100 fs laser pulses having a central wavelength of 800 nm at a repetition rate of 1 kHz. The laser pulses are focused by a anti-reflection coated, plano-convex lens 36 (e.g., having a focal length of about 250-nm) through the quartz window onto the sample surface. In this exemplary embodiment, the lens is mounted on a single axis linear translation stage and positioned such that its focal point is behind the sample. By moving the lens, and hence its focal point, the laser spot size can be varied at the sample surface (e.g., from a diameter of about 30 microns to 250 microns). In order to measure the laser spot size, a CCD (charge coupled device) camera 38 can be placed at the same distance as the sample surface from the lens. A flipper mounted mirror 40 can redirect the laser beam onto the camera to determine its spot size on the sample surface. A second CCD camera 42 can measure reflections of light generated by a white light fiber lamp 44 from the sample surface to monitor progress during microstructuring.

In one exemplary mode of operation, samples attached to a magnetizable sample holder can be loaded through the access door and attached to the mounting magnet. Samples can be then positioned in the center of the magnet to allow for maximum translation. The chamber can be evacuated to a base pressure of $10^{-3}$ torr and then filled to the desired pressure with an ambient gas (e.g., 0.67 bar of sulfur hexafluoride). The sample can then be irradiated with a 1-kHz train of 100-femtosecond 800-nm laser pulses. The fluence of each pulse can be set by selecting a spot size (e.g., 150 microns) and employing a waveplate/polarizing cube combination to vary the pulse energy. Either a single spot can be irradiated, or more typically the sample can be translated by utilizing the motion controller relative to the laser beam. For example, the sample can be translated in a raster scan pattern. An average number of pulses irradiating a given spot on the sample can be controlled by utilizing a shutter and varying the horizontal translation speed.

Figure 3:
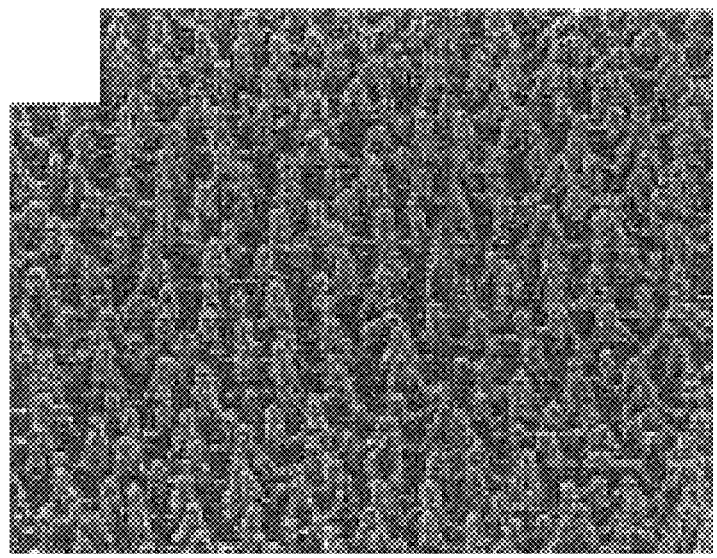
FIG. 3 is a scanning electron micrograph of a silicon surface, obtained at a 45-degree angle relative to the surface, after irradiation of the surface with 100 fsec pulses having a central wavelength of 800 nm and a fluence of about 5 kJ/m$^2$, FIG. 4 schematically illustrates an experimental set-up for performing resistivity and Hall effect measurements on a silicon sample microstructured in accordance with the teachings of the invention.

The irradiation of the silicon surface with the laser pulses in the presence of $SF_6$ at a selected partial pressure, for example, a partial pressure in a range of about 0.005 bar to about 1 bar, can cause formation of a sulfur-rich layer having a sulfur concentration in a range of about 0.1 atom percent to about 5 atom percent, and more preferably, in a range of about 0.5 atom percent to about 1 atom percent. This sulfur-rich layer exhibits an undulating surface morphology (topography) with micron-sized surface height variations. Such a textured surface obtained by irradiating a silicon surface with a plurality of temporally short laser pulses in the presence $SF_6$ (or other substances having an electron-donating constituent) is herein referred to as a microstructured surface. By way of example, FIG. 3 shows a scanning electron micrograph (SEM) of a such a microstructured silicon surface (obtained in a direction forming a 45 degree angle relative to the surface) after irradiation of the silicon surface with an average of 5 shots of femtosecond laser pluses (100 femtoseconds) at a wavelength of 800 nm and having a fluence of 8 kJ/m2 in 0.67 bar of $SF_6$.

The sulfur-rich layer can be a substantially disordered layer that is several hundred nanometers thick and made up of nanocrystallites (e.g., about 10-50 nm in diameter) and nanopores. Selected area diffraction (SAD) measurements indicate that the surface layer retains a substantial crystalline order with a strong possibility that amorphous-like material is present between the nanocrystalline grains. Further, SAD measurements performed on silicon substrates exposed to either 10 or 500 pulses per location indicate that the substrate below the disordered layer comprises substantially undisturbed crystalline silicon (when a crystalline silicon substrate is utilized). Further, Rutherford backscattering spectroscopy (RBS) and energy dispersive X-ray (EDX) emission spectroscopy performed on such exemplary substrates show a large concentration of sulfur is present in the disordered layer (about 1 atom percent). Further, RBS spectra obtained from silicon samples exposed to different femtosecond (100 femtoseconds) laser shots per irradiation location show that the concentration of sulfur increases with increasing laser pulse numbers up to about 50 pulses. In particular, the measured sulfur concentration increases from about 0.2 atom percent for a sample exposed to 2 pulses per location to about 0.7 atom percent for a sample exposed to 50 laser pulses per location with the sulfur concentration exhibiting a plateau for laser pulses higher than about 50. It should be, however, understood that the above experimental results are provided simply for further elucidation of salient features of the invention, and not as limiting the scope of the invention. For example, higher sulfur concentrations in the disordered layer than those described above can also be obtained, and higher laser shots per location can be utilized.

A number of factors can affect the morphology of the microstructured surface. For example, samples microstructured by irradiating a portion thereof with laser pulses, without moving them relative to the laser beam (i.e., single spot irradiation), exhibit a subtle difference in their morphology relative to samples microstructured by irradiating a plurality of their surface locations via translation relative to the laser beam. With the rest of the experimental parameters left the same, there are two visible differences between translated and stationary samples. The microstructures in the stationary samples have a micrometer-sized sphere at the tip while the translated samples are sharper and lack the spheres. Further, the translated samples have a larger amount of nanoscale particles spread across the microstructured surface.

In addition, the wavelength of the irradiating laser pulses, their fluence, and pulsewidths can also affect the morphology of the microstructured surface. For example, in a number of prototype samples microstructured by femtosecond pulses, with increasing the fluence (at constant shot number) the morphology showed a transition from laser-induced periodic surface structures, to a coarsened surface, to sharp microstructures, such as those depicted in the above FIG. 3. As the laser pulse fluence increases, there is typically an increase in both the microstructure height and distance between the microstructures. In general, the fluence is preferably selected to be above a threshold fluence that would cause melting (e.g., 1.5 kJ/m$^2$). At very high fluences (e.g., greater than 12 kJ/m$^2$), material removal can become extreme and gaussian-shaped holes, rather than conical structures, can be formed in the surface.

Although in many embodiments described herein, femtosecond laser pulses are employed, in other embodiments, the microstructuring of the surface can also be achieved by employing picosecond or nanosecond pulses. For example, a number of silicon samples were microstructured by utilizing a train of 248-nm, 30-ns laser pulses with a flat-top spatial profile and a fluence of 30 kJ/m$^2$ generated by a KrF+excimer laser in the presence of 1 bar of $SF_6$ (an average of 1500 pulses per spot were employed). The nanosecond-laser-formed microstructures showed some similarities and some differences relative to the femtosecond-laser-formed microstructures. In both cases, the microstructures were roughly conical, but the structures formed with the femtosecond laser pulses were smaller and more densely packed. For example, the femtosecond structures were roughly 8 microns tall and separated by about 4 microns while the nanosecond-formed structures were roughly 40 microns tall and separated by about 20 microns. Further, the femtosecond-formed structures were covered with nanoparticles 10-50 nm in diameter while the surface of the nanosecond-formed structures were much smoother.

Sample silicon wafers exposed to picosecond pulses (e.g., 10 picosecond) in the presence of $SF_6$ also showed a microstructured surface. The average separation between the microstructures exhibited a decrease from about 100 femtosecond pulse widths to about 5 picosecond pulse widths but then showed an increase for pulse widths longer than about 5 picoseconds.

The laser wavelength can also affect the final morphology of the microstructures. By way of example, a prototype silicon sample microstructured with a train of 400 nm pulses exhibited a higher density of microstructures (but smaller) than those generated by 800 nm pulses at a similar fluence.

Other factors that can affect the microstructures' morphology include laser polarization and laser propagation direction relative to the irradiated silicon surface. For example, the direction of microstructure growth is parallel to the direction of incident light, and appears to be independent of the substrate's crystallographic planes. The base of microstructure can have an elliptical shape with the long axis perpendicular to the polarization of the irradiating laser light. Without being limited to any theory, this elliptical shape can be understood as being due to a higher absorption of p-polarized light relative to s-polarized light. For circularly polarized light, there is no preferential ablation, and the base of the microstructures can be substantially circular.

The fluid or solid in contact with the silicon surface during its microstructuring can also affect the resultant surface morphology. For example, utilizing $SF_6$ or $Cl_2$ as the ambient gas can lead to sharp-tipped conical structures with a radius of curvature of about 500 nm. In contrast, structures made in air, $N_2$ or vacuum are much more rounded (the radius of curvature of their tips is approximately 2-3 microns) than those made in these halogen-containing gases. In a number of exemplary samples microstructured in the presence of different gases, those made in $SF_6$ exhibited the greatest density of microstructures followed by those made in $Cl_2$. The microstruture densities produced in the presence of $N_2$ were approximately equal to those made in air, but approximately a factor of two less than the densities obtained by employing $SF_6$.

In some embodiments, the laser microstructuring of a silicon wafer is performed in the presence of a mixture of two or more substances. For example, samples microstructured in the presence of a mixture of $SF_6$ and $Cl_2$ exhibited an increase in the microstructure density at higher partial pressure of $SF_6$.

The sulfur-rich microstructured layer has unique optical and electrical properties. For example, it can exhibit a sheet charge carrier density in a range of about $10^{12}$ cm$^{-2}$ to about $10^{14}$ cm$^{-2}$. By way of example and only for illustrative purposes, the results of some resistivity and Hall effect measurements performed on a number of exemplary microstructured samples, each formed in an n-doped silicon substrate in accordance with the teachings of the invention, such as those described above, are presented below. For resistivity and Hall effect measurements, the van der Pauw technique, well-known to those having ordinary skill in the art, was employed. Briefly, four ohmic electrical contacts were formed on the disordered microstructured layer. The electrical contacts were formed by initially dipping a microstructured sample in a 5% HF solution for 5 minutes to remove any native oxide layer. Subsequently, with a mask covering all but the very corners of a selected microstructured surface area (e.g., a 10×10 mm$^2$ surface area), chromium/gold (Cr/gold) was evaporated onto the surface to form metal contacts at the exposed corners. A dicing saw was then used to cut slivers (e.g., 0.25 mm slivers) from each side. Cutting the sample edges ensures that the contacts are only connected to the surface layer and not the substrate layer. Finally, a wire bonder is utilized to connect the contacts on the corners of the sample to four Cr/Au contact pads evaporated onto a glass slide. It should be understood that this experimental arrangement, shown schematically in FIG. 4, is sensitive primarily to the electronic properties of the microstructured layer, and not that of the substrate.

Figure 4:
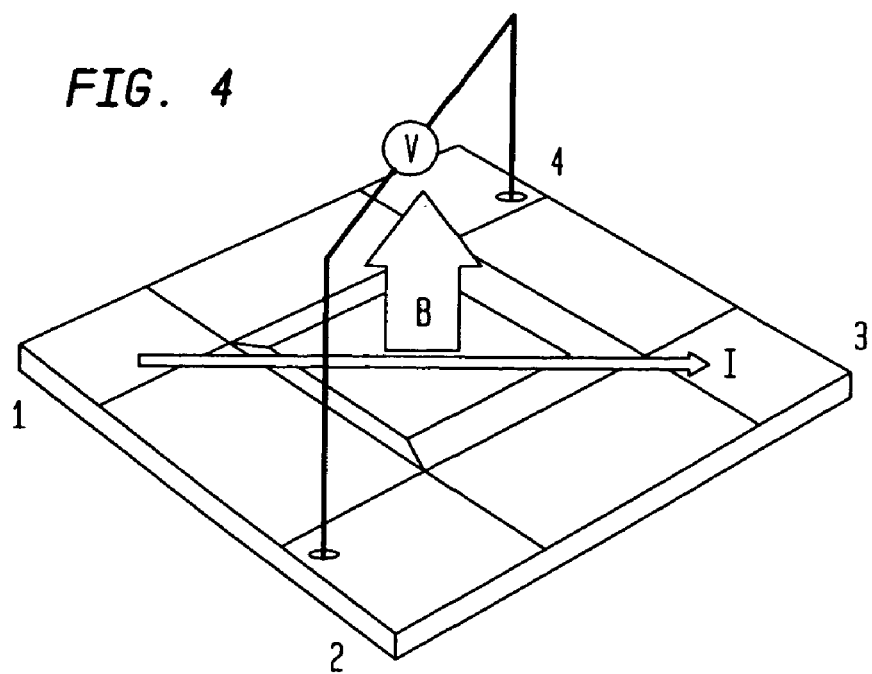

With continued reference to FIG. 4, the resistivity measurements can be performed by applying a small DC current (e.g., 10 microamperers) from corner 2 to corner 1 while measuring a voltage from corner 3 to corner 4. Hall effect measurements can be performed by placing the sample in a strong magnetic field (e.g., a field of several thousand gauss) with the magnetic field perpendicular to the silicon surface. In one experiment, a small AC current (about 1-2 microamperes) was then applied from contact 1 to contact 3 while measuring an induced voltage across contacts 2 and 4. Control measurements were also performed on an n-doped (resistivity=8-12 ohm-m) unstructured silicon wafer. Table 1 below lists the results of these measurements for microstructured layers formed in an n-doped silicon wafer having a resistivity in a range of about 8-12 ohm-m at a number of different laser pulse fluences.

| Original doping | Average fluence (kJ/m$^2$) | Doping after structuring | Sheet resistance Rs (Ohm) | Sheet carrier density n$_s$ (cm$^{-2}$) | Hall mobility μ (cm$^2$V$^{-1}$s$^{-1}$) |
|---|---|---|---|---|---|
| n | un-structured | — | 31931 | $1.78 \times 10^{11}$ | 1101 |
| n | 4.0 | n | 4865 | $7.37 \times 10^{12}$ | 174 |
| n | 6.0 | n | 4992 | $7.15 \times 10^{12}$ | 175 |
| n | 8.0 | n | 6253 | $4.52 \times 10^{12}$ | 221 |
| n | 10.0 | n | 4554 | $8.83 \times 10^{12}$ | 155 |

This data shows that microstructured layer exhibits a higher sheet carrier density than the original substrate, but a lower carrier mobility—presumably as a result of the disorder in the microstructured layer.

Referring again to the flow chart 10 of FIG. 1, subsequent to irradiation of the silicon surface with a plurality of laser pulses (step 10*a*), the substrate can annealed (step 10*b*) at a sufficiently elevated temperature for a selected time duration so as to cause an increase in the charge carrier density in the microstructured layer, e.g., by a factor in a range of about 10 percent to about 200 percent. For example, the substrate can be annealed at a temperature in a range of about 500 K to about 1100 K, and more preferably, in a range of about 500 K to about 900 K, for a selected time duration, e.g., a time duration in a range of about a few minutes to about a few hours (e.g., one-half hour).

The annealing step can be performed by employing a variety of different techniques. For example, the substrate can be placed in a thermal oven to be exposed to an elevated temperature for a selected duration. Alternatively, the substrate can be exposed to laser radiation, e.g., radiation having a wavelength in a range of about 200 to about 1200 nm, to cause its heating to a desired temperature. Further, the annealing step can be performed, for example, in an inert atmosphere (e.g., an argon atmosphere) or in a vacuum (a low-pressure environment). Alternatively, the annealing step can be applied simultaneously with the irradiation step. That is, the irradiation of the silicon substrate with the laser pulses can be performed while the substrate is maintained at an elevated temperature.

Without being limited to any theory, the annealing step is designed to cause a rearrangement of the atomic bonds within the metastable microstructured layer to enhance the density of charge carriers—electrons—within that layer. The term "charge carrier density" is known to those having ordinary skill in the art. To the extent that any further explanation may be required, it refers to density of those charged particles, e.g., electrons, that are primarily responsible for current conduction, e.g., electrons in the conduction band states or in shallow impurity states below the conduction band. Such charged carriers are also herein referred to as free electrons or holes.

In other words, the annealing temperature and duration are selected to cause structural changes in the microstructured layer that result in increasing the carrier density in that layer while substantially maintaining responsivity of the layer for generating an electrical current when exposed to radiation within a selected wavelength range at a given applied back bias voltage, as discussed in more detail below. The structural changes caused in the microstructured sulfur-rich layer by an annealing step according to the teachings of the invention can be appreciated by considering that in many embodiments in which a p-doped silicon substrate is exposed to a plurality of laser pulses to generate a microstructured surface layer therein, holes, rather than electrons, constitute the dominant charge carriers even after incorporation of about 1 atom percent sulfur having two possible donor electrons per atom. However, after annealing, electrons can constitute the dominant charge carriers in the microstructured layer. Without being limited to any particular theory, such observations suggest that sulfur in the microstructured layer, before annealing, is incorporated in silicon such that its donor electrons do not substantially contribute to conduction (the donor electrons are likely locked up in a trap, or perhaps the coordination number of the implanted sulfur is larger than four). An annealing step according to the teachings of the invention causes atomic bond rearrangements in the microstructured layer so as to free up donor electrons for contributing to electrical conduction. In fact, in case of p-doped silicon substrates, the number of donor electrons released during annealing can be sufficiently large to eliminate the holes as the dominant charge carriers and turn the microstructured layer into an n-doped layer having a sheet carrier concentration on the order of about $10^{14}$ cm$^{-2}$.

Figure 5:
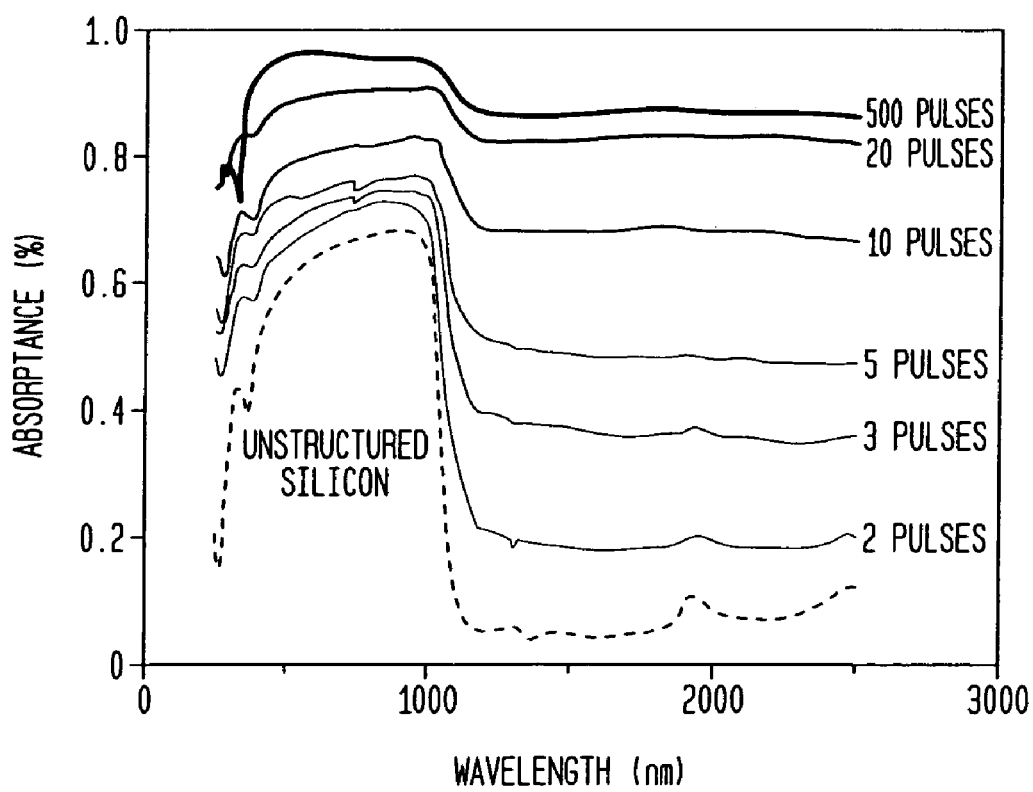
FIG. 5 presents a plurality of graphs depicting wavelength absorptance of prototype microstructured silicon wafers as a function of an average number of 100 laser shots (8 kJ/m$^2$) per location employed for microstructuring the wafers in the presence of $SF_6$.

A microstructured silicon wafer formed in accordance with the teachings of the invention exhibits absorption of incident electromagnetic radiation, particularly radiation having wavelengths in a range of about 250 nm to about 2500 nm. By way of example, FIG. 5 presents absorption data for a microstructured silicon wafer (an n-Si (111) wafer having a thickness of about 260 microns and a resistivity in a range of about 8-12 ohm-m), each of which was generated by exposing its surface to 100 femtosecond laser pulses (2 to 500 shots per location) having a central wavelength of 800 nm and a fluence of about 8 kJ/m$^2$. This exemplary absorption data was recorded in a manner known in the art, prior to annealing the wafer, by employing an spectrophotometer equipped with an integrating sphere. The absorption data for an unstructured silicon wafer is also provided for comparative purposes.

This exemplary data indicates that the microstructured wafers exhibit an enhanced absorption of incident electromagnetic radiation, relative to unstructured silicon, across the entire recorded wavelength range, and particularly for wavelengths above about 1050 nm, which corresponds to the band-gap energy of crystalline silicon (1.05 eV). In the unstructured silicon, light photons having wavelengths longer than a wavelength corresponding to the band-gap energy do not contain sufficient energy to promote an electron from the valence band to the conduction band, leading to a drastic drop in absorption.

In contrast, the silicon wafers microstructured in accordance with the teachings of the invention exhibit significant absorption not only for wavelengths below the band-gap but also for those above it. In fact, the exemplary data of FIG. 5 shows that silicon wafers structured by exposure to 20 pulses per location or higher (e.g., 500 pulses in this exemplary data set) exhibit near-unity, featureless absorption of wavelengths from about 0.4 micron to about 1 micron, a small decrease in absorption for wavelengths around about 1.05 micron (a wavelength corresponding to the band edge of unstructured silicon), and strong featureless absorption from about 1.05 microns to about 2.5 microns. It should be understood that this data is presented only for illustrative purposes, and is not necessarily intended to present the optimal absorption of a silicon wafer structured in accordance with the teachings of the invention.

Figure 6:
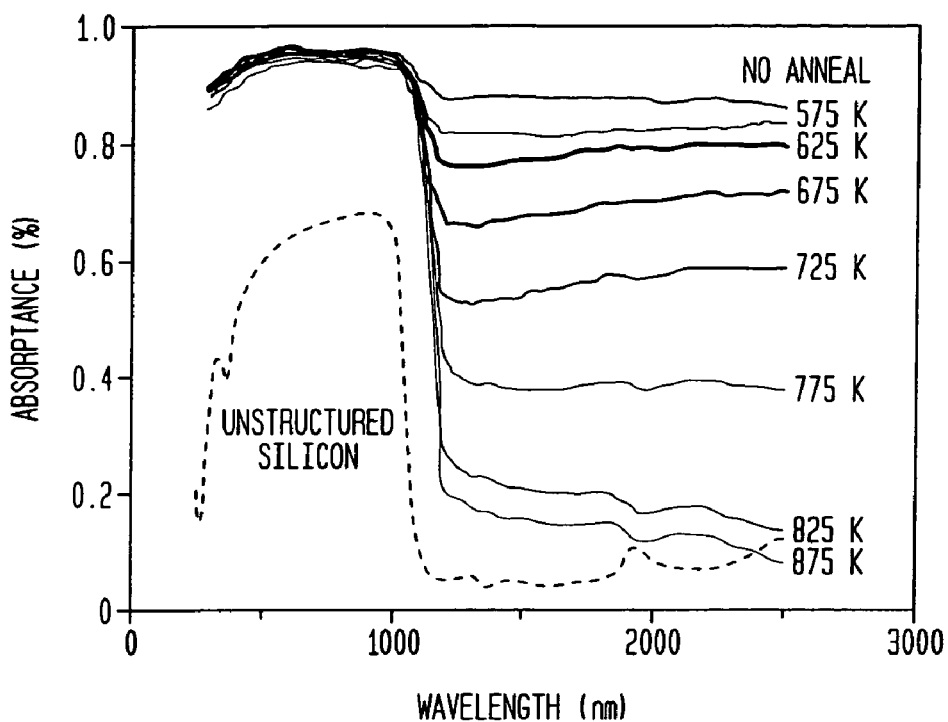
FIG. 6 presents a plurality of graphs depicting wavelength dependence of absorptance of a plurality of prototype silicon wafers annealed at different temperatures subsequent to their microstructuring by a plurality of femtosecond laser pulses (the room temperature (300 K) data corresponds to a wafer that was not annealed)

As noted above, in many embodiments of the invention, a microstructured wafer is annealed at a temperature and for a duration designed to enhance the charge carrier concentration in its microstructured layer. Such annealing can be performed at a variety of different temperatures. By way of example, FIG. 6 schematically illustrates electromagnetic radiation absorptance data for a plurality of microstructured silicon wafers generated by utilizing 500 laser pulses per surface location (100 fs pulses at a central wavelength of 800 nm and a fluence of 8 kJ/m2) in the presence of 0.67 bar of SF$_6$ relative to that of unstructured silicon. Each structured wafer was annealed at a selected temperature in a range of about 575 K to about 875 K for about 30 minutes. This exemplary data shows that annealing at temperatures below about 575 K has little effect on the observed absorptance. On the other hand, such annealing performed at a temperature between about 575 K and 875 K does not substantially affect absorptance above the bandgap, but lowers the below bandgap absoptance—the higher the annealing temperature, the greater is the reduction in absorptance. It should, however, be understood that this data is only exemplary, and different results may be obtained for microstructured wafers generated by employing different parameters (e.g., difference fluence or laser shot numbers).

Figure 7:
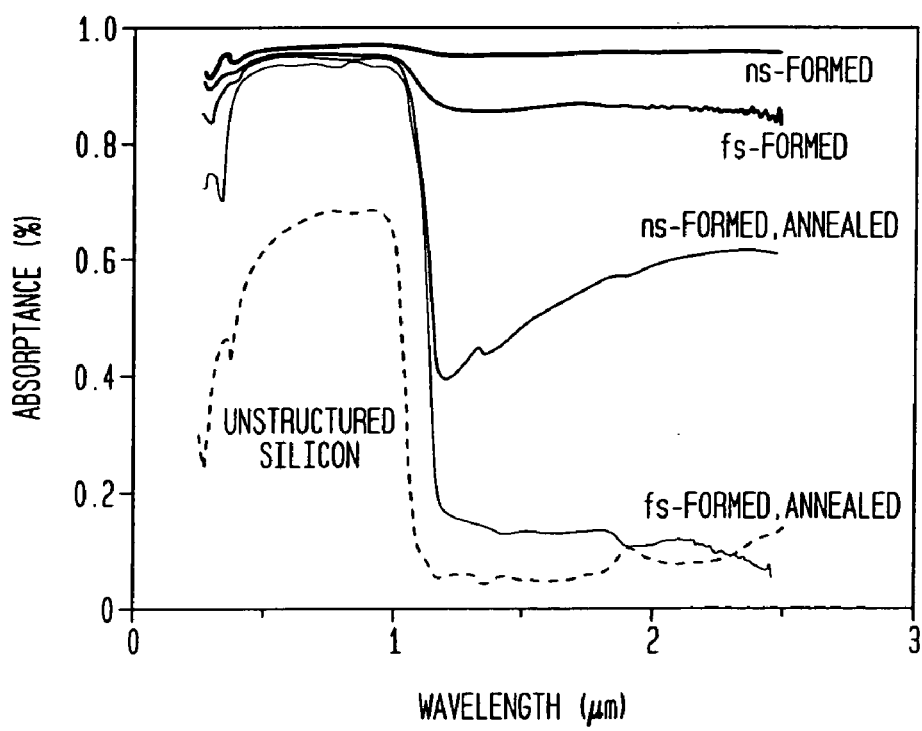
FIG. 7 presents graphs depicting wavelength dependence of absorptance for exemplary femtosecond-laser-formed and nanosecond-laser-formed microstructured silicon wafers, before and after thermal annealing at 875 K for about 30 minutes (the absorptance of an unstructured silicon substrate as a function of wavelength is also shown for comparative purposes)

A microstructured silicon wafer according to the teachings of the invention can be generated not only by utilizing femtosecond pulses, but also other pulse widths (e.g., nanosecond and picosecond pulse widths). By way of example and only for illustrative purposes, FIG. 7 illustrates exemplary absorptance graphs as a function of incident radiation wavelength for femtosecond-laser-formed and nanosecond-laser-formed microstructured silicon surfaces, before and after annealing at about 875 K for about 30 minutes, as well as that of an unstructured silicon wafer. The femtosecond-formed mircrostructures were generated by employing 100 fs laser pulses (500 shots per location) having a central wavelength of about 800 nm and a fluence of about 8 kJ/m$^2$. The nanosecond-formed microstructures were generated by employing 30 ns laser pulses (about 1500 shots per location) having a central wavelength of 248 nm and a fluence of about 30 kJ/m$^2$. It should be understood that this data is presented only for illustrative purposes and is not intended to necessarily indicate absorptance exhibited by a microstructured silicon formed in accordance with the teachings of the invention under all circumstances.

Figure 8A:
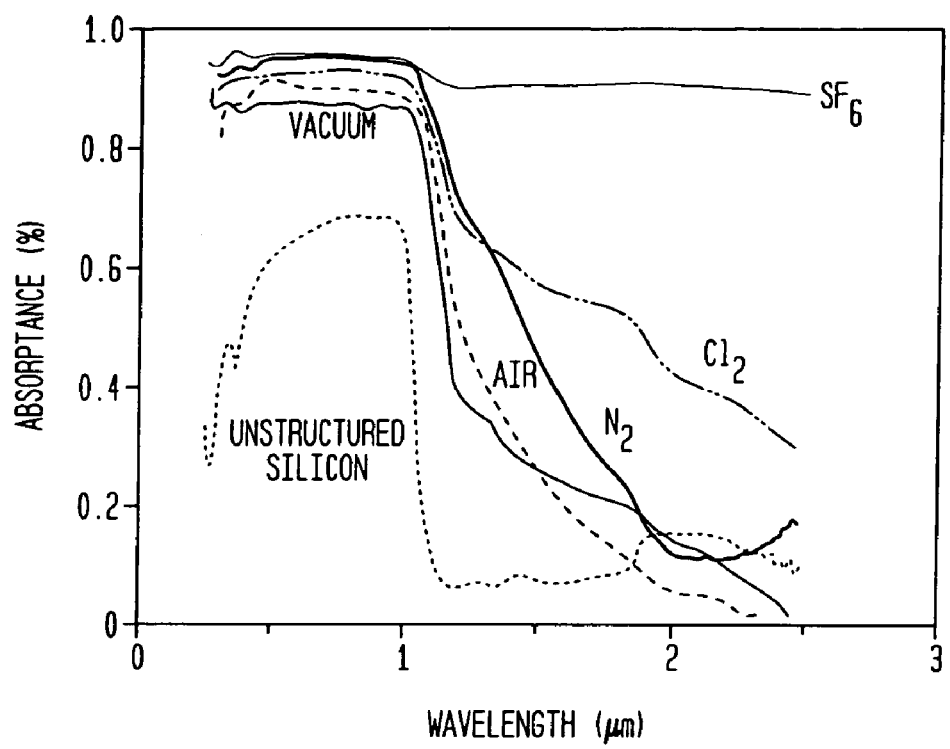
FIG. 8A presents graphs depicting absorptance as a function of wavelength for a plurality of prototype silicon wafers microstructured by exposure to 500 laser shots of femtosecond pulses (fluence of 8 kJ/m$^2$) in the presence of different gases in the absence of annealing (the graph designated vacuum relates to a wafer microstructured in a vacuum chamber at a base pressure less than about $10^{-6}$ bar)
Figure 8B:
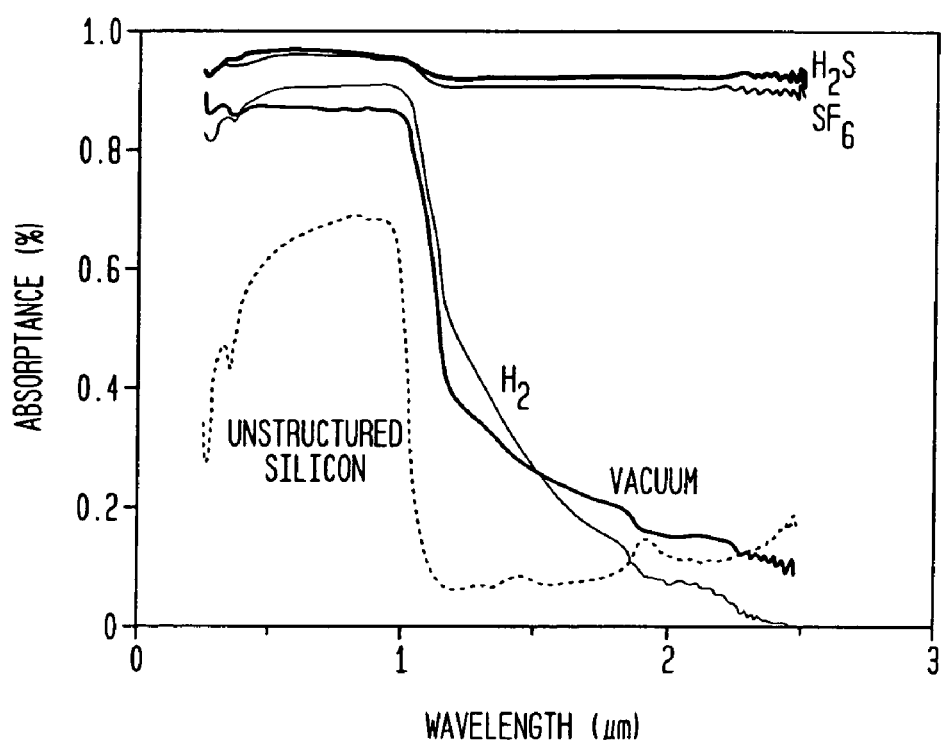
FIG. 8B presents absorptance data as a function of wavelength for a plurality of prototype silicon wafers microstructured by exposure to 500 shots of 100 femtosecond laser pulses (fluence of 8 kJ/m$^2$ in the presence of sulfur-bearing and non-sulfur-bearing gases) indicating the positive effects of sulfur incorporation in enhancing below band-gap absorptance.

In some embodiments of the invention, microstructuring of a silicon wafer can be accomplished in the presence of a background fluid rather than SF$_6$. For example, H$_2$S, Cl$_2$, N$_2$ or air can be utilized. By way of example, FIGS. 8A and 8B compare absorptance of some exemplary prototype microstructured silicon wafers generated by employing femtosecond laser pulses (100 fs, 800 nm, 8 kJ/m$^2$ and 500 shots per location) in the presence of various fluids—without an annealing step—with that of unstructured silicon. The vacuum data corresponds to microstructuring the wafer in a chamber evacuated to a base pressure that is less than about $10^{-6}$ bar. While all microstructured samples exhibit an enhanced absorption relative to unstructured silicon, this exemplary data shows the microstructuring in $SF_6$ and $H_2S$ brings about the most dramatic change in absorptance relative to unstructured silicon. In particular, samples structured with $SF_6$ exhibit near-unity, substantially featureless absorptance across the entire measured spectrum.

Figure 9:
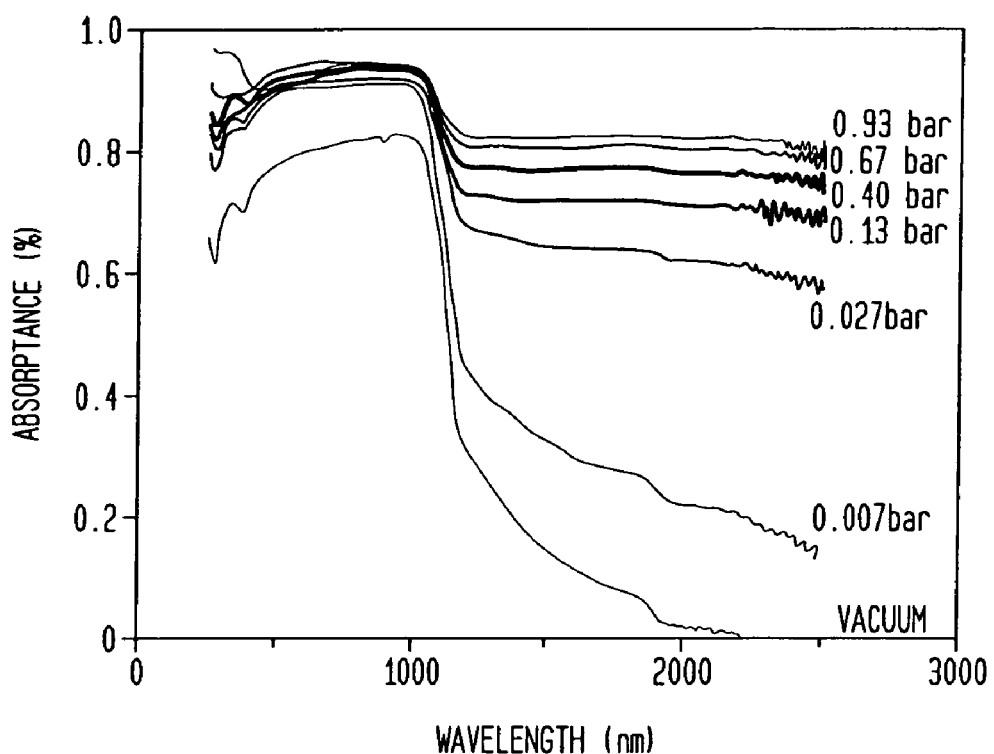
FIG. 9 presents graphs depicting wavelength dependence of absorptance for a plurality of prototype silicon wafers microstructured by femtosecond laser pulses in the presence of $SF_6$ at different partial pressures, FIG. 10 schematically illustrates a p-n junction in thermal equilibrium.

A variety of background fluid pressures can be employed in many embodiments of the invention for generating microstructured silicon wafers. By way of example, FIG. 9 shows absorptance data for a number of exemplary prototype microstructured silicon wafers generated in $SF_6$ (100 fs pulses, 800 nm, 500 shots per location) at different ambient pressures, as well as a wafer microstructured in vacuum (e.g., a pressure of less than $10^{-6}$). The greatest rate of increase is observed at low pressures. In this exemplary data set, at pressures above about 27 mbar, the below band-gap absorptance does not show much variation with wavelength, while at lower pressures, it decreases with increasing wavelength.

The microstructured silicon wafers generated in accordance with the teachings of the invention, particularly those subjected to an annealing step at an elevated temperature in a range of about 500 K to about 900 K, not only exhibit enhanced absorption of electromagnetic radiation over a wide range (e.g., from ultraviolet wavelengths to near infrared), but they also exhibit voltage-versus-current profiles that are characteristic of diodes. As discussed in more detail below, these properties allow the use of such microstructured silicon wafers in fabricating photodetectors that exhibit enhanced responsivity relative to conventional silicon photodetectors.

Figure 10:
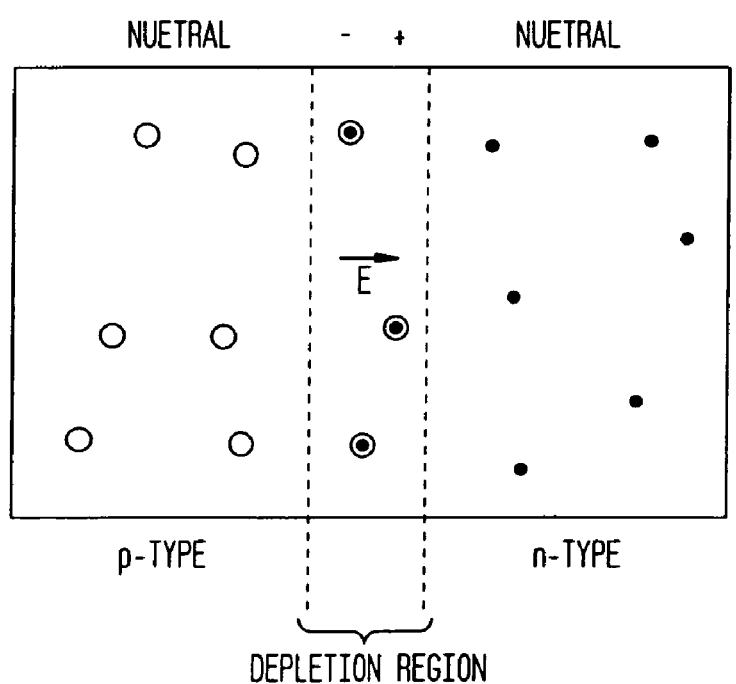

More specifically, a microstructured silicon layer formed in accordance with the teachings of the invention, particularly one formed by exposure of a wafer surface to laser pulses followed by, or simultaneous with, an annealing step designed to release electrons in the layer structured by the pulses, forms a diode junction, e.g., a p-n junction, with the underlying silicon substrate. It should be understood that a diode junction as used herein can also refer a junction formed between two n-doped portions having different free electron densities. As shown schematically in FIG. 10, a p-n junction can be formed by bringing a semiconductor material having acceptor impurity atoms (p-doped) into contact with a semiconductor material having donor impurity atoms (n-doped). The difference in charge carrier concentration between the p-doped and the n-doped portions generates a diffusion potential across the junction—electrons and holes begin to diffuse across the junction to portions having a respective lower concentration. As they cross to the other side of the junction, they recombine with their oppositely charged electrical counterparts in a region very close to the junction. This migration of charge carries across the junction causes formation of space charges (immobile ions) with opposite polarities on the two sides of junction. As the number of space charges increases (positively charged for the n-type side and negatively changed for the p-type side), a potential difference builds up across the junction, which results in an electric field in a direction opposite that of the diffusion potential.

Upon reaching thermal equilibrium, a thin insulating layer is present near the junction in which charge carriers have been depleted by recombination (depletion region). A strong electric field is present in the depletion region and a large electric potential exists across this region. The junction can be reverse-biased by applying an electric field across it that reinforces this internal electric field. Such a reverse-bias voltage expands the insulating depletion region and enhances both the internal electric field and the potential difference across the junction. The junction can also be forward-biased by applying an electric field that is opposite to the internal field across it. Such a forward-bias voltage shrinks the depletion region, thereby diminishing the internal electric field and the potential difference across the junction. When forward-biased, a current flows across the junction with electrons injected into the n-doped portion and leaving from the p-doped portion. In other words, the p-n junction can act as a rectifier by allowing current flow in only one direction. This behavior gives rise to a current-voltage (I-V) curve characteristic of a diode.

As discussed above, a silicon wafer in which a microstructured layer is formed according to the teachings of the invention can exhibit an I-V curve characteristic of that obtained by a diode junction. Without being limited to any theory, such a current-voltage behavior can be understood by considering that the wafer includes two adjacent, yet distinct, layers: a surface layer in which a concentration of an electron-donating constituent is incorporated and an underlying substantially undisturbed silicon substrate layer. These two layers exhibit different crystalline structures, chemical compositions, and charge carrier doping concentrations. In addition, the microstructured layer has unique optical properties including high absorptance of incident electromagnetic radiation from the near ultraviolet into the near-infrared wavelengths. In one aspect, the invention employs such microstructured silicon wafers for fabricating photodiodes, as discussed in more detail below.

Figure 11A:
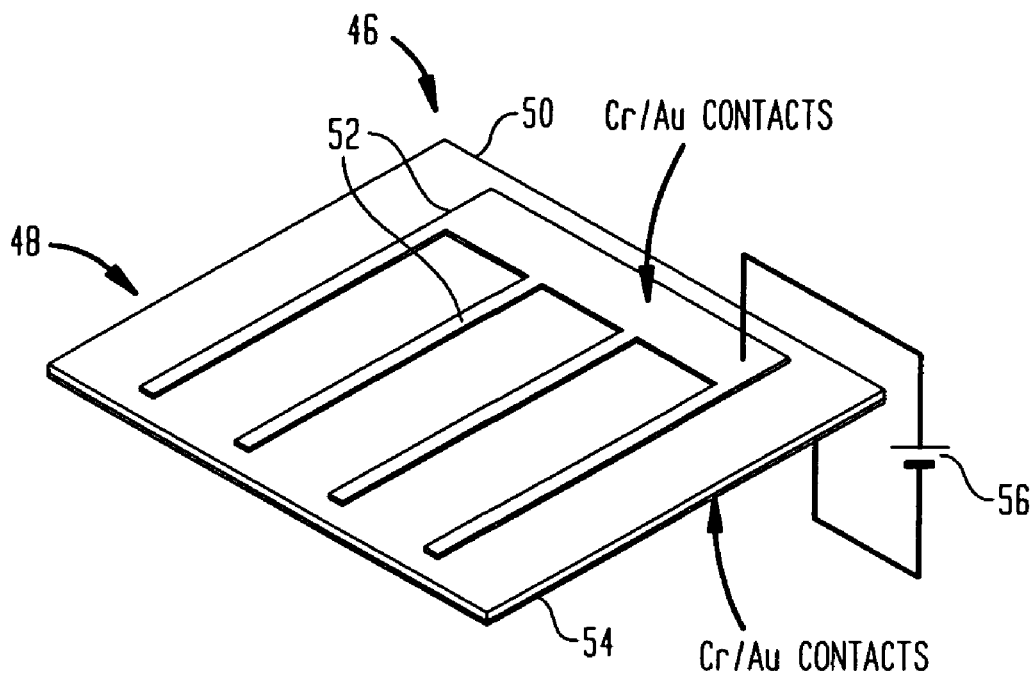
FIG. 11A is a perspective view of a photodetector formed in accordance with one embodiment of the invention.
Figure 11B:
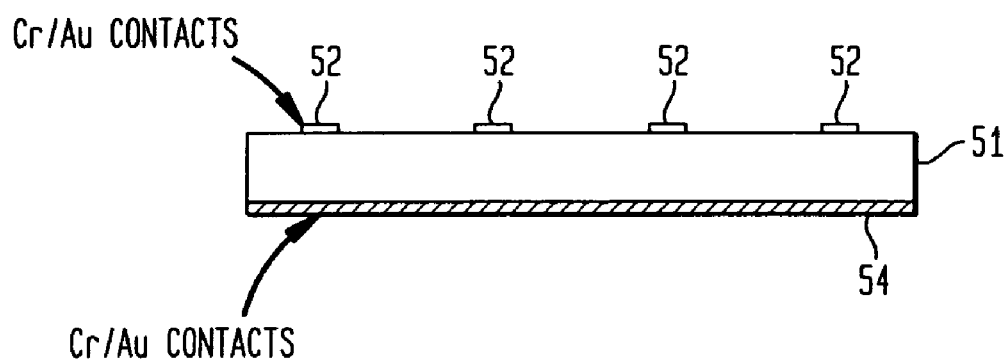
FIG. 11B is a side view of the photodetector depicted in FIG. 11A.

By way of example, FIG. 11A schematically illustrates a photodetector 46 according to one embodiment of the invention that includes a microstructured silicon wafer 48 having a microstructured surface layer 50 that is formed in a silicon substrate 51 by irradiating a plurality of locations on a substrate's surface with short laser pulses (e.g., pulse widths in a range of about tens of femtoseconds to tens of nanoseconds) while exposing the surface to a substance having an electron-donating consitutent (e.g., $SF_6$). The laser-irradiated wafer is then annealed under conditions (e.g., at an elevated temperature and for a selected duration) designed to enhance concentration of electrons in the microstructured surface layer (e.g., annealing at a temperature in a range of about 500 K to about 900 K for a duration of a few minutes to a few hours).

The exemplary photodetector 46, functioning as a photodiode, also includes a plurality of metallic electrical contacts 52, which have a finger grid geometry, that are disposed on the microstructured surface layer. In addition, an electrical contact 54, in the form of a metallic coating layer, is disposed on the back surface of the silicon substrate (i.e., the undisturbed silicon surface opposite the microstructured surface) that substantially covers the entire surface. In this exemplary embodiment, a chromium/gold alloy (Cr/Au) is employed for fabricating the electrical contact. However, those having ordinary skill in the art will appreciate that the contacts can be formed of other metals, as well.

The metallic contacts 52 and 54 allow applying a bias voltage, e.g., a reverse bias voltage, across the wafer by employing, for example, a voltage source 56. The reverse bias voltage can reinforce the internal electrical field in the depletion layer of a diode junction formed between the microstructured layer 50 and the underlying silicon substrate 51. As discussed in detail below, the photodetector 46 can operate with small bias voltages, e.g., voltages in a range of about 0.1 V to about 15 V, with a responsivity (i.e., photocurrent generated per unit of power of incident light (amperes/watts)) that is considerably better than that typically exhibited by a conventional silicon photodetector. These attributes allow incorporating silicon photodetectors formed according to the teachings of the invention, such as the exemplary photodetector 46, into integrated silicon photoelectronic circuits as high sensitivity detectors.

In operation, radiation (i.e., photons) incident on the microstructured surface layer of the photodiode's silicon wafer is absorbed (when the radiation wavelength is in the operating range of the photodetector), e.g., by valence electrons, in the microstructured layer. The absorption of the incident radiation causes generation of electron-hole pairs. The electric field within the depletion region causes separation of the generated electron-hole pairs, especially those created at or in proximity of the diode junction, which is formed between the microstructured silicon layer and the underlying silicon substrate. The separated electron-hole pairs provide a photocurrent that is proportional to the number of incident photons (those skilled in the art appreciate that such a photocurrent is added to a generation current and a recombination current that can be inherently present in a diode junction). Hence, incident radiation can be detected, and quantified, by measuring the induced photocurrent.

Figure 12:
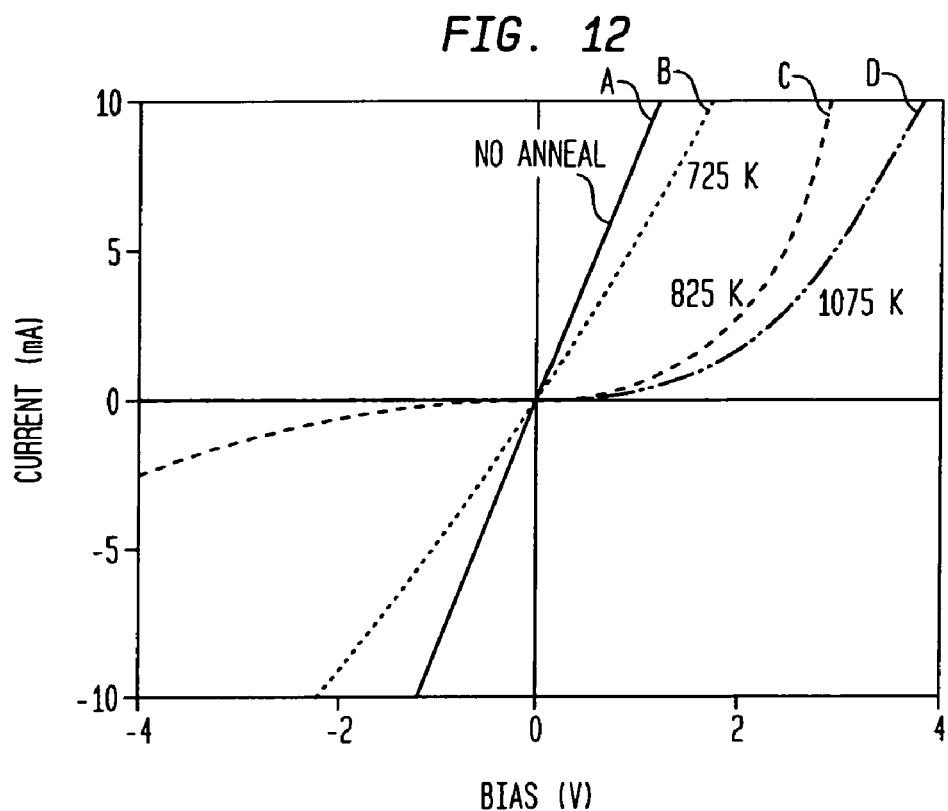
FIG. 12 presents graphs depicting current-voltage characteristics of a plurality of exemplary silicon wafer microstructured by exposure to femtosecond laser pulses in the absence of annealing as well as in the presence of annealing at different annealing temperatures.

A photodetector formed according to the teachings of the invention not only exhibits absorptance across a wide range of wavelengths (the absoptance is generally commensurate with that exhibited by the photodetector's microstructured silicon wafer), but it also exhibits a diodic I-V behavior. By way of example and further elucidation of the salient features of a photodetector of the invention, FIG. 12 illustrates a plurality of graphs, each representing current as a function of bias voltage for a plurality of microstructured silicon samples prepared under different conditions in an n-doped silicon substrate for use as the active component of photodetectors. All samples were irradiated with a plurality of femtosecond laser pulses (800 nm, 100 fs, fluence of 4 kJ/m$^2$) in the presence of SF$_6$, but were subjected to different annealing conditions. The graph A represents the current-voltage curve associated with a microstructured sample that was not annealed. This curve is substantially linear, indicating that the junction between the microstructured layer and the underlying silicon substrate in this sample is not diodic, but is merely resistive. In other words, such a wafer is not optimal for fabricating a photodetector.

In contrast, graphs B, C, and D illustrate current-versus-voltage behavior of those microstructured silicon samples that were subjected to annealing at different temperatures (the annealing duration was about 30 minutes in all cases). This exemplary data indicates that with an increase in the annealing temperature, the measured I-V curve approaches one expected from a diode. For example, at an annealing temperature of about 825 K, the I-V curve is diodic, characterized by an exponentially increasing current for a forward bias and a smaller, less rapidly increasing current for a reverse bias. The I-V curve corresponding to an annealing temperature of about 1075 K is also diodic. However, annealing a microstructured silicon wafer for a significant duration at a very elevated temperature can lead to a degradation of the below-band gap absorptance, and hence a degradation in the performance of a photodetector utilizing such a microstructured wafer in the near-infrared. In this exemplary data set, the substrate annealed at 825 K exhibit an optimal I-V characteristic. It should, however, be understood that such very elevated annealing temperatures may be employed so long as the annealing duration is sufficiently short. In general, the annealing of a microstructured silicon wafer to be employed in a photodetector of the invention should be carefully designed (i.e., annealing temperature and duration) to cause release of electrons in the microstructured surface layer without significantly degrading the wafer's absorptance of and responsivity to incident radiation.

Figure 13:
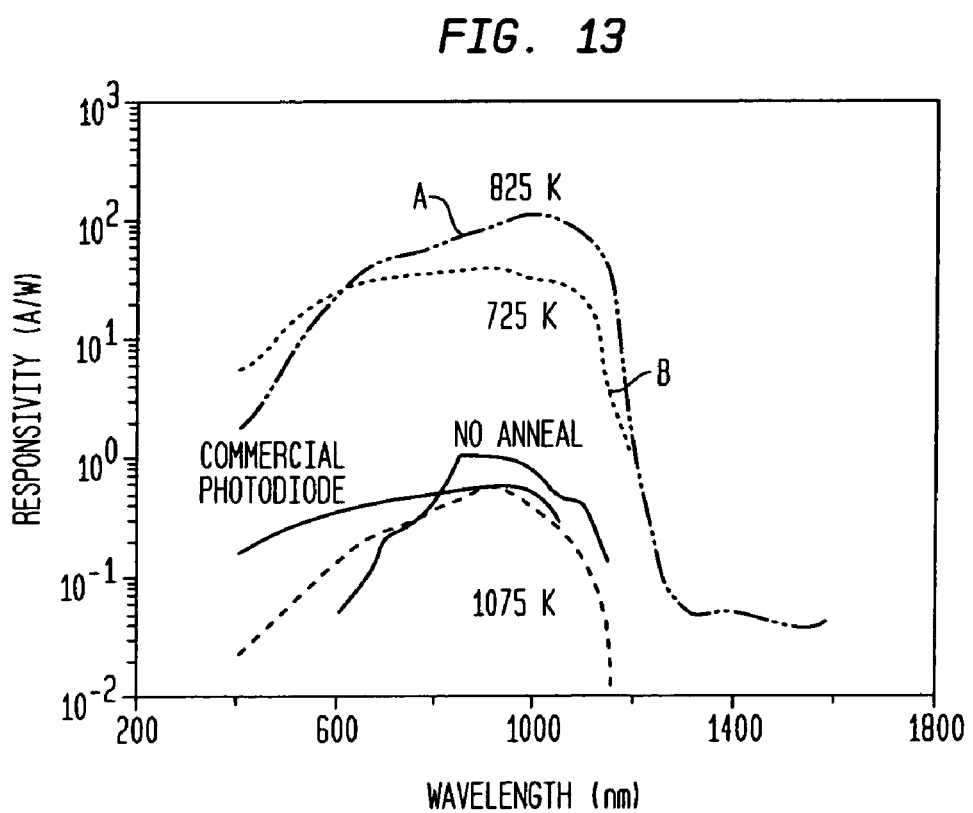
FIG. 13 presents graphs depicting responsivity of a plurality of silicon wafers microstructured by exposure to femtosecond laser pulses in the presence of $SF_6$ (with no annealing and with annealing at different temperatures) as a function of wavelength in comparison with that of a commercial photodiode illustrating that a significantly enhanced responsivity can be obtained by judicious annealing of wafers subjected to laser microstructuring, FIG. 14 present graphs depicting current-voltage characteristics of a plurality of exemplary prototype silicon wafers microstructured by femtosecond laser pulses at different laser fluences and each annealed at 825 K.

A photodetector of the invention, such as the above exemplary photodetector 46, exhibits a responsivity that can be superior across a wavelength range of about 250 nm to about 10 microns to that of a conventional silicon photodiode. By way of example and only for illustration and corroboration purposes, FIG. 13 presents experimental graphs representing responsivity of exemplary photodetectors formed in accordance with the teachings of the invention, over a selected wavelength range, in comparison with a conventional photodiode and those fabricated by employing microstructured silicon, but with no annealing or annealing at too high a temperature. In particular, graphs A and B show that photodetecotors of the invention that employ silicon wafers microstructured by femtosecond laser pulses in the presence of SF$_6$ (100 fs, 800 nm central wavelength and a fluence of 4 kJ/m$^2$) followed by annealing at 825 K or 725 K, exhibit a significantly enhanced responsivity relative to that of a conventional commercially available silicon photodiode. In particular, these photodetectors exhibit a responsivity that is more than an order of magnitude greater that that of the conventional photodiode in a wavelength range of about 250 nm to about 1050 nm. Although the responsivity shows a decrease for wavelengths longer than the band-gap edge (i.e., wavelengths longer than about 1050 nm), nonetheless, it remains significantly higher than that exhibited by a conventional silicon detector. In fact, conventional silicon detectors typically do not operate at useful levels of responsivity at wavelengths that are longer than the band-gap edge. For example, in this exemplary illustration, the responsivity of the commercial photodiode drops steeply to about $10^{-6}$ A/W for wavelengths longer than about 1050 nm Further, the responsitivy data for wafers formed according to the teachings of the invention (e.g., graphs A and B) were obtained by applying small bias voltages (e.g., a bias voltage of about −0.5 volts in this exemplary embodiment). In contrast, conventional silicon photodetectors exhibit much lower responsivities, or require much higher bias voltages (e.g., 100 to 1000 volts) and/or have more complex structures. This indicates that while photodetectors formed in accordance with the teachings of the invention can be readily incorporated in integrated silicon circuitry, the incorporation of conventional silicon detectors, which require large bias voltages, into integrated silicon circuits can be impractical.

The data depicted in FIG. 13 also shows that proper annealing of a silicon wafer irradiated by a plurality of short laser pulses, as described above, can considerably enhance the responsivity of a photodetector that employs that wafer. In particular, a photodetector fabricated by utilizing a wafer that, though exposed to laser pulses, was not annealed, exhibits a much degraded responsivity relative to those that were subjected to an annealing step at appropriate temperatures, e.g., at 725 K or 825 K. This exemplary data also shows that a photodetector that incorporates a microstructured wafer annealed, subsequent to irradiation by laser pulses, at a temperature of 1075 for thirty minutes exhibits a much degraded responsitivy relative to those annealed at 725 K or 825 K.

Hence, one aspect of the invention relates to annealing a silicon wafer, subsequent to—or simultaneous with—its irradiation by a plurality of short pulses in the presence of a substance having an electron-donating constituent, under conditions that would release electrons in the microstructured layer while preserving the responsivity of the wafer for detecting electromagnetic radiation. For example, in some embodiments of the invention, the annealing temperature is selected to be in range of about 500 K to about 1100 K, and more preferably in a range of about 700 K to about 900 K, and the annealing duration is selected to be in a range of about 1 minute to about several hours, and more preferably in a range of about 5 minutes to about 30 minutes. Alternatively, higher annealing temperatures can be employed so long as the annealing duration is properly selected to avoid degrading the responsivity of the resultant annealed wafer. For example, although the above data indicates that annealing the wafer at temperature of about 1075 K for about 30 minutes may not be desirable, this annealing temperature with a lower annealing duration can be suitable for practicing the invention in certain applications. To certain extent, annealing temperature and duration are inter-related. For example, shorter annealing time at a higher temperature can be employed in certain applications.

In other words, it is not simply annealing at an elevated temperature that is required. Rather, the annealing temperature and its duration need to be properly selected to ensure that a photodetector exhibiting enhanced responsivity over a wide wavelength range can be fabricated by utilizing the annealed wafer. It has been discovered that annealing a silicon wafer subsequent to, or simultaneous with, its exposure to short laser pulses in presence of a substance having an electron-donating constituent at a temperature that is too low can lead to noisy photodiode and annealing at too high a temperature and duration can lower the wafer's response to both visible and infrared wavelengths. More specifically, the annealing temperature and duration are preferably selected to enhance the concentration of carrier electrons in the microstructured layer—formed by laser irradiation in presence of a substance having an electron-donating constituent—by a factor in a range of about 10% to about 200% while ensuring that the resultant annealed wafer exhibits a responsivity greater than about 20 A/W at least at one wavelength, and preferably over the entire span, of a wavelength range of about 250 nm to about 1050 nm, and a responsivity greater than about 0.1 A/W at least at one wavelength, and preferably over the entire span, of a wavelength range of about 1050 nm to about 3500 nm. By way of example, in some embodiments of the invention, the annealing temperature is preferably selected to be in a range of about 700 to about 900 K.

Figure 14:
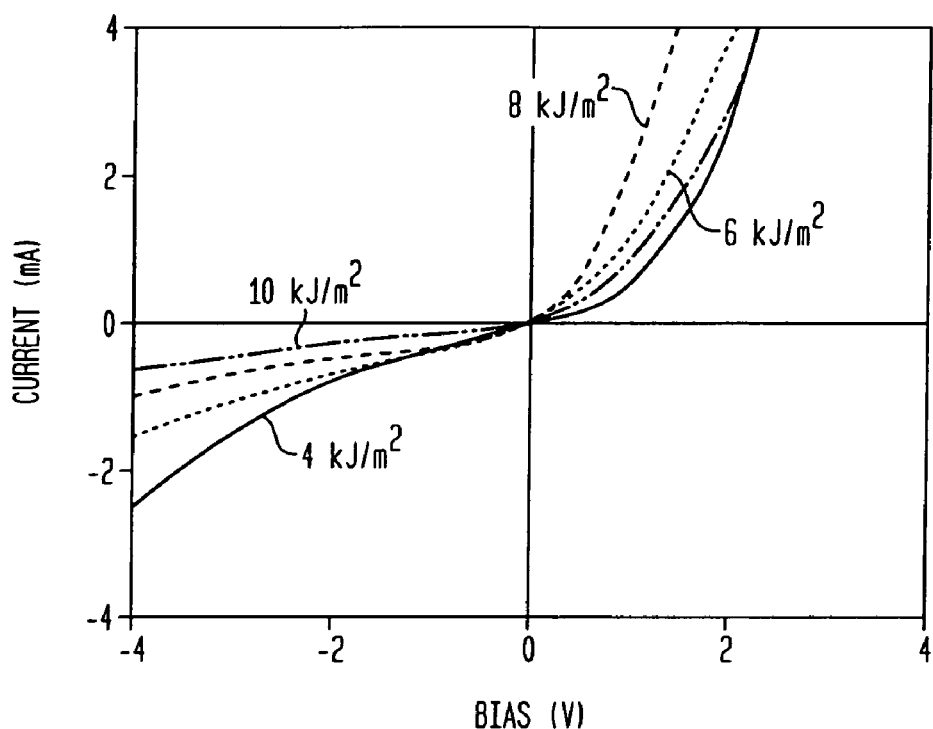

The choice of the fluence of laser pulses irradiating a silicon wafer to generate a microstructured layer therein can also affect the performance characteristics of a photodetector that incorporates the microstructured wafer for detecting radiation. By way of example, FIG. 14 presents exemplary data corresponding to current-voltage characteristics of a plurality of silicon wafers irradiated with a plurality of femtosecond laser pulses (100 fs, 800 nm central wavelength, 200 pulses per location) in the presence of $SF_6$ followed by annealing at 825 K for about 30 minutes. The laser pulse fluences, however, differed from one wafer to another. More particularly, the following laser fluences were employed: 4 $kJ/m^2$, 6 $kJ/m^2$, 8 $kJ/m^2$, and 10 $kJ/m^2$. This exemplary data indicates that increasing the fluence decreases the dark current for a given reverse bias voltage.

Figure 15A:
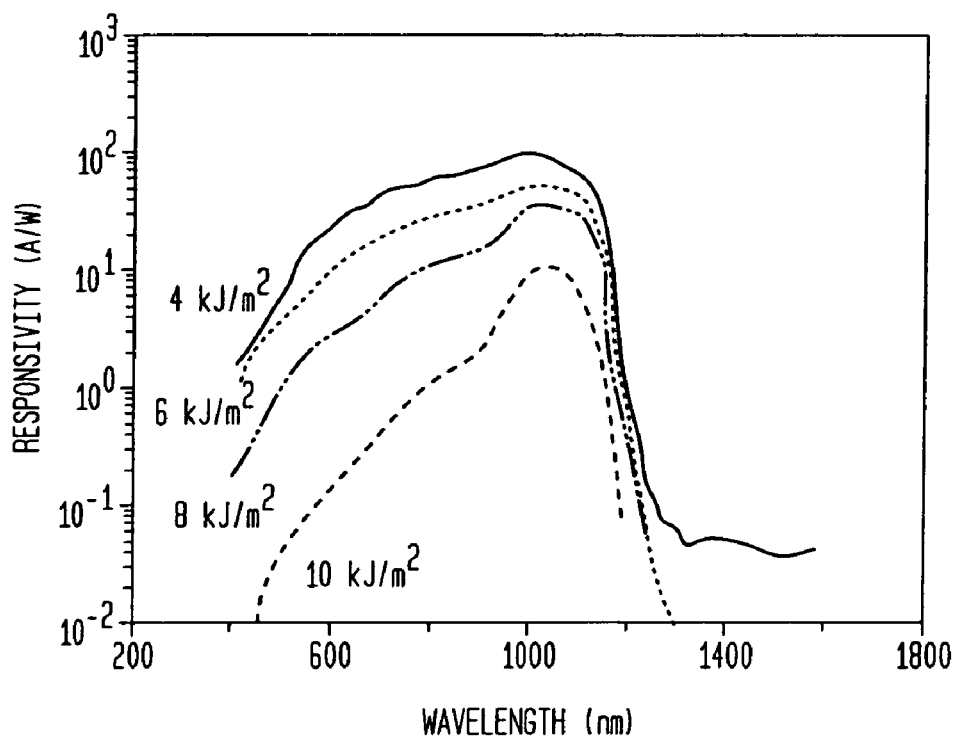
FIG. 15A presents comparative responsivity measurements for prototype silicon wafers microstructured by femtosecond laser pulses at different fluences and each annealed at 825 K for about 30 minutes.
Figure 15B:
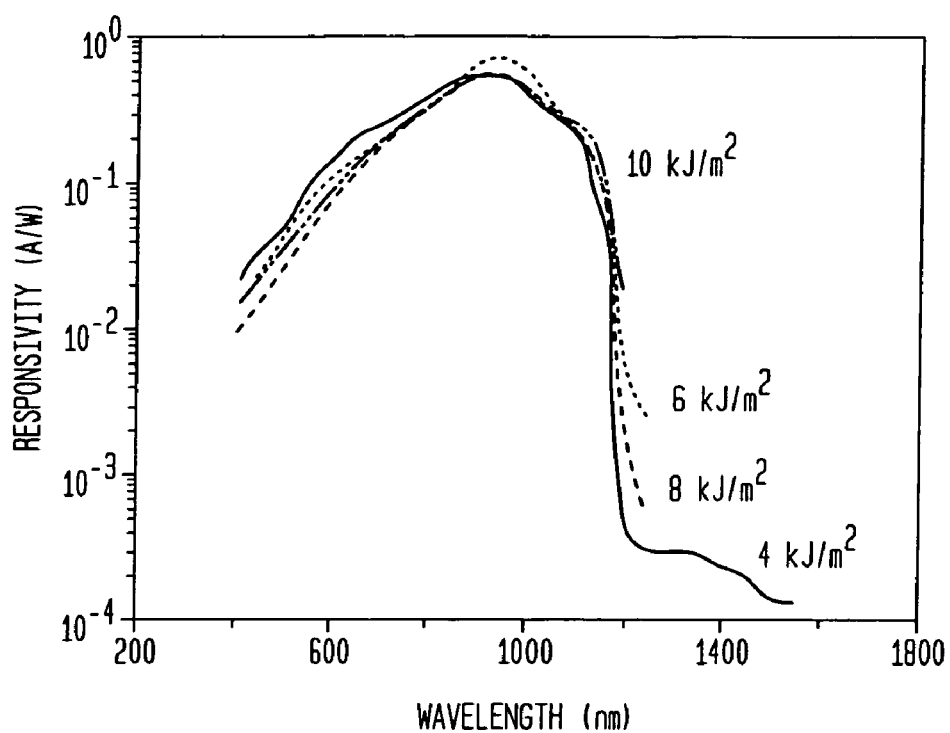
FIG. 15B presents comparative responsivity measurements for prototype silicon wafers microstructured by femtosecond laser pulses at different fluences and each annealed at 1075 K for about 30 minutes.

FIG. 15A illustrates the responsivity of a plurality of photodetectors incorporating the above silicon wafers that were microstructured with different laser pulse flunces (the wafers were annealed at 825 K for 30 minutes). This exemplary responsivity data indicates that, in this sample set, the photodetector's responsivity decreases, and the wavelength of peak response shifts to longer wavelengths, with increasing fluence (the sample made with a fluence of 4 $kJ/m^2$ exhibits the highest response). By way of further illustration, FIG. 15B presents responsivity data for photodetectors made with microstructured silicon wafers that were generated through irradiation with femtosecond pulses (100 fs, 800 nm central wavelength, 200 pulses per location) in the presence of $SF_6$ followed by annealing at 1075 K for about 30 minutes. The laser pulse fluences, however, varied from one sample to the next (4 $kJ/m^2$, 6 $kJ/m^2$, 8 $kJ/m^2$, and 10 $kJ/m^2$). A comparison of this data with the data presented in FIG. 15A shows that the responsivity exhibited by the samples subjected to the higher annealing temperature of 1075 is much lower that that of the samples annealed at 825 K. However, the samples annealed at the higher temperature exhibit much less variation in responsivity as a function of fluence. Further, the samples annealed at 1075 K—though exhibiting a lower responsivity—are less noisy and have a higher quantum efficiency.

It should be understood that the above data is presented only for illustration purposes, and is not intended to necessarily indicate an optimal fluence under all conditions. For example, the above exemplary samples were made with an average laser shot number of about 200 pulses, and may exhibit improved characteristics with a greater shot number. In general, in various embodiments of the invention, the laser pulse fluence is selected to be greater than about 3 $kJ/m^2$. More preferably, the fluence is chosen to be in a range of about 3 $kJ/m^2$ to about 10 $kJ/m^2$, or a range of about 3 $kJ/m^2$ to about 8 $kJ/m^2$.

Figure 16A:
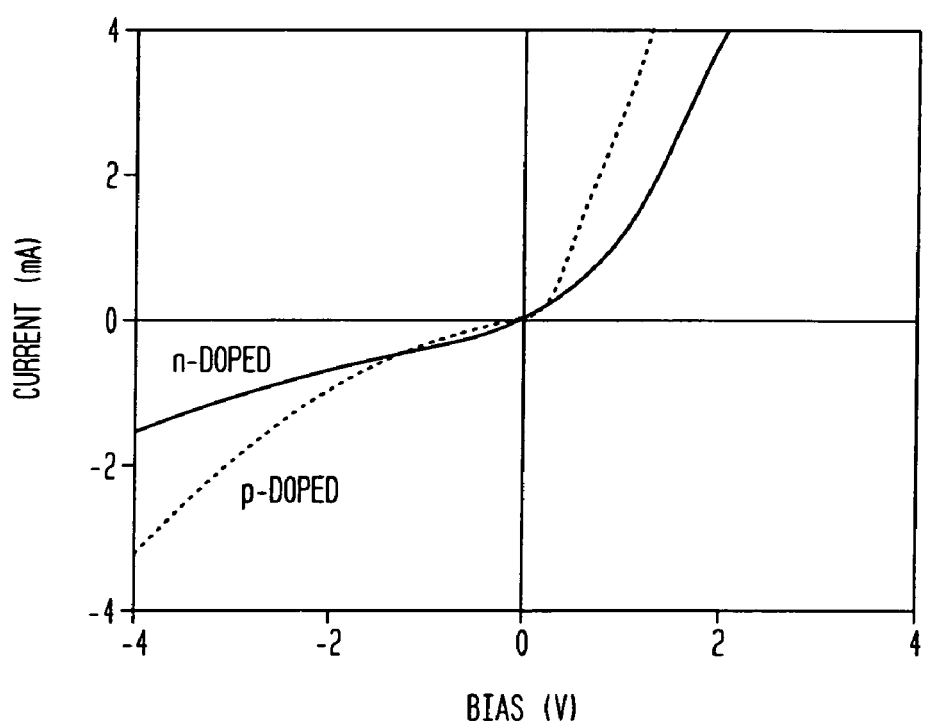
FIG. 16A presents current-voltage characteristics for n-doped and p-doped silicon substrates microstructured by exposure to femtosecond laser pulses at a fluence of 6 kJ/m$^2$ followed by annealing at 825 K for about 30 minutes.
Figure 16B:
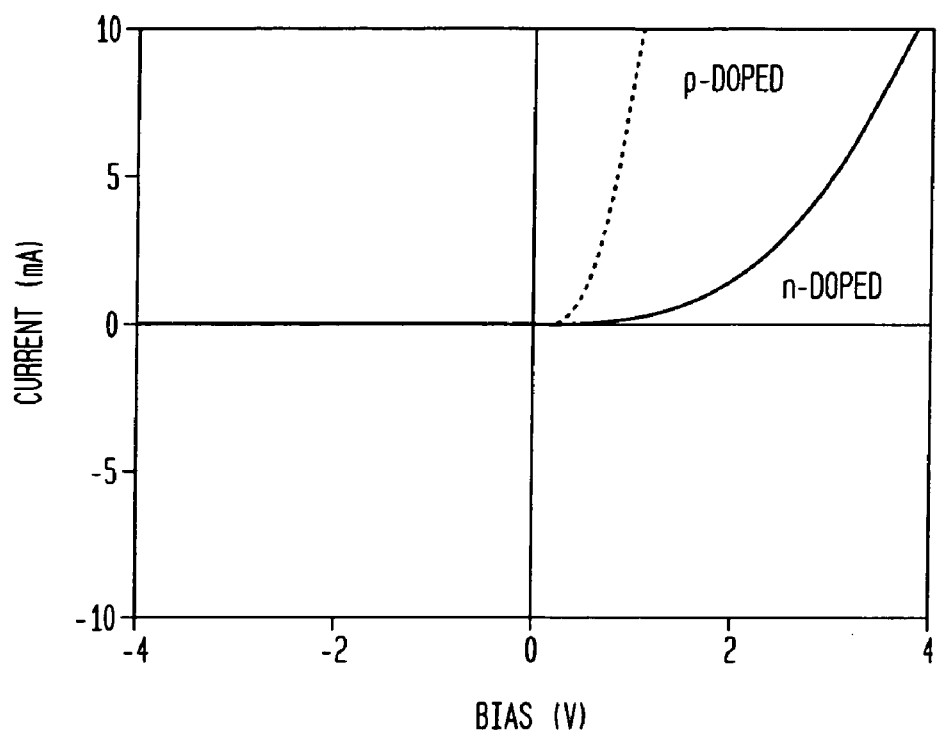
FIG. 16B presents current-voltage characteristics for n-doped and p-doped silicon substrates microstructured by exposure to femtosecond laser pluses at a fluence of 4 kJ/m$^2$ followed by annealing at 1075 K for about 30 minutes.

In many embodiments of the invention an n-doped silicon substrate is employed for forming a microstructured wafer, as described above. Alternatively, a p-doped silicon wafer can be utilized. By way of example, FIG. 16A presents graphs comparing the diodic characteristics of a microstructured wafer generated according to the teachings of the invention, such as those described above, employing a p-doped silicon substrate (p-Si(100), 350 micron thick, resistivity ($\rho$) greater than 1 ohm-cm) with one fabricated utilizing an n-doped silicon substrate. In both cases, a laser pulse fluence of about 6 $kJ/m^2$, an annealing temperature of about 825 K, and an annealing duration of about 30 minutes were utilized. Similar data is presented in FIG. 16B for p-dopend and n-doped samples annealed at 1075 K for about 30 minutes.

This exemplary data shows that the p-doped samples annealed at 825 K exhibit a higher forward bias current than equivalently generated n-doped samples. The dark current for back biases also increases more rapidly for p-doped samples. Upon annealing at 1075 K, the p-doped samples exhibit very good diodic properties with the back bias decreasing to substantially the same level as that in equivalently generated n-doped samples. Further, the forward bias current increases more rapidly, resulting in good rectification ratios. As noted above, annealing at higher temperatures can increase donor concentration from sulfur doping. Such increase in the donor concentration can lead p-doped samples annealed at higher temperature to exhibit better rectification.

Figure 17A:
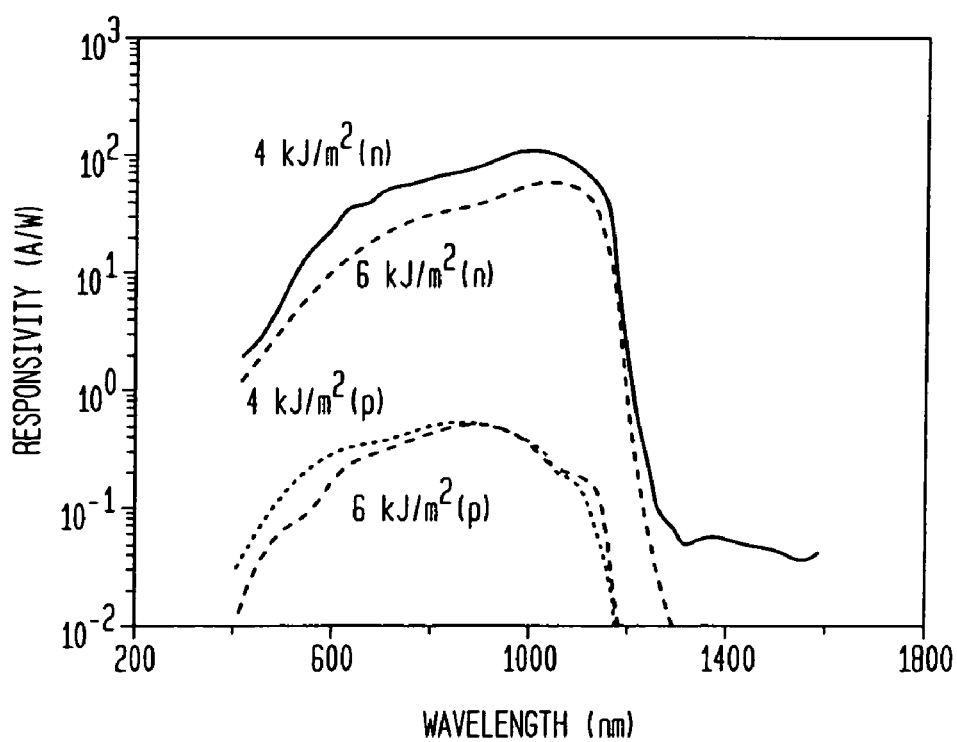
FIG. 17A presents responsivity measurements for prototype exemplary n-doped and p-doped silicon substrates microstructured at two different laser fluences (4 kJ/m$^2$ and 6 kJ/m$^2$) and annealed at 825 K for about 30 minutes.
Figure 17B:
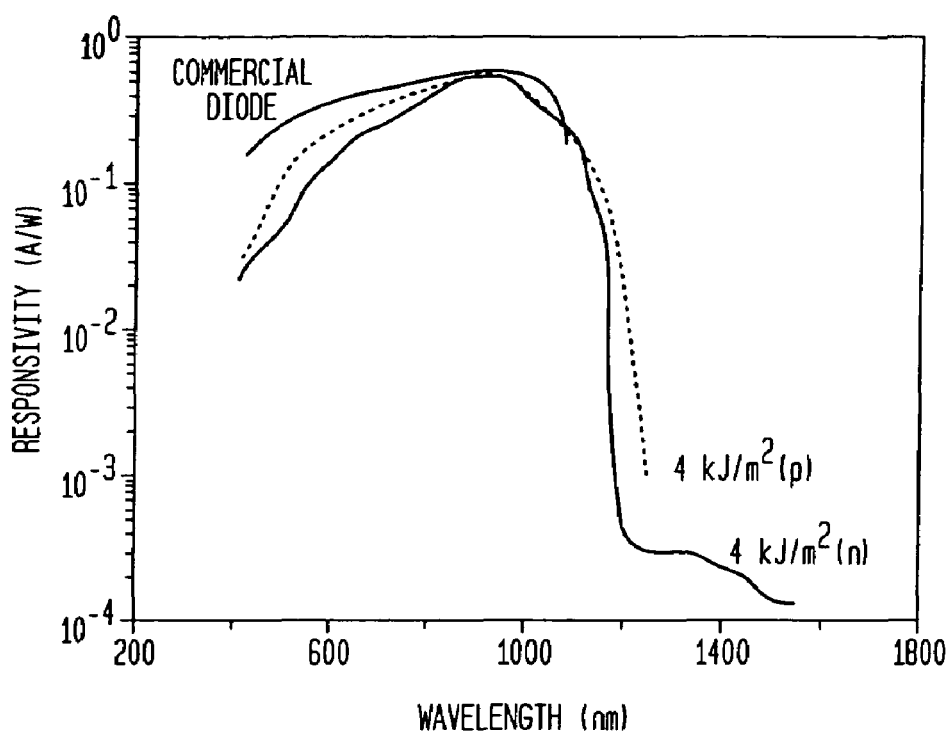
FIG. 17B presents responsivity measurements for prototype exemplary n-doped and p-doped silicon substrates microstructured by femtosecond laser pulses at a fluence of 4 kJ/m$^2$ and annealed at 1075 K for about 30 minutes.

A silicon substrate's doping can also affect the responsivity of a silicon wafer formed by microstructuring that substrate in accordance with the teachings of the invention. By way of example, FIG. 17A shows measured responsivity data for two n-doped microstructured wafers and two p-doped microstructured wafers, both of which were annealed at 825 K for about 30 minutes. This exemplary data indicates that the responsivity of n-doped substrates is higher over the measured spectral range. However, FIG. 17B shows that the responsivities of microsturctured wafers formed in p-doped and n-doped substrates, via laser irradiation and annealing at a higher temperature of about 1075 K, are nearly identical.

In general, the above illustrative data indicates that microstructured p-doped samples have a lower response but exhibit a better quantum efficiency. It should be understood that the above data is presented only for illustrative purposes and is not intended to limit the scope of the invention. In general, both p-doped and n-doped substrates can be employed in the practice of the invention, and the resultant diodic characteristics and responsivity of microstructured wafers generated by utilizing such substrates can be different than those depicted above based on selection of other parameters, such as laser fluence, number of pulses, etc.

In addition to responsivity, another parameter of interest associated with performance of a photodetector can be its quantum efficiency. The term 'quantum efficiency' is known in the art, and is generally defined as the number of electron-hole pairs generated per incident photon at a zero applied voltage. In some cases, a microstructured sample that exhibits a high level of responsivity may not show a correspondingly high level of quantum efficiency. For example, in the above exemplary prototype microstructured silicon wafers, samples fabricated by employing n-doped substrates, laser pulses having a fluence of 4 kJ/m$^2$, and an annealing temperature of about 825 K exhibit the highest responsivity, but not the highest quantum efficiency. In fact, samples fabricated by employing similar conditions but a higher annealing temperature of 1075 K show higher quantum efficiencies, though lower responsivities. Similarly, the measured responsivities of samples made on p-doped substrates and annealed at 825 K or 1075 K are lower, but their quantum efficiencies are higher. Such variations of responsivity and quantum efficiency are preferably considered when selecting various parameters in practicing the teachings of the invention for fabricating a silicon photodetector.

Figure 18:
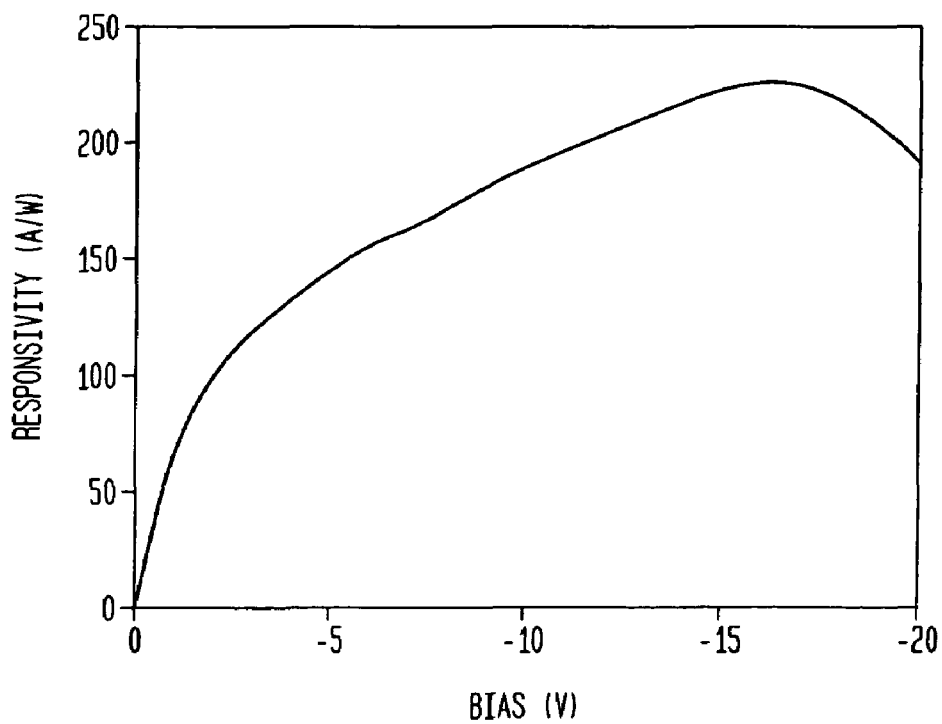
FIG. 18 presents a graph depicting responsivity as a function of back bias for an n-doped silicon substrate microstructured via irradiation by femtosecond laser pulses at a fluence of 4 kJ/m$^2$ and annealed at 825 K for about 30 minutes (the measurement was performed by employing a white light source with an approximate power of 50 microwatts)

The responsivity of a photodetector fabricated in accordance with the teachings of the invention can also vary as a function of a back bias applied thereto. Typically, the responsivity increases as the applied back bias increases. By of example, FIG. 18 exhibits the responsivity of a silicon wafer microstructured in accordance with the teachings of the invention through irradiation by a plurality of femtosecond pulses at a fluence of 4 kJ/m$^2$ followed by annealing at 825 K for about 30 minutes, as a function of an applied back bias voltage. The sample was illuminated with a white light source with an approximate power of 50 microwatts. The responsivity, and hence gain, increases quickly up to a bias voltage of −5 volts and more slowly up to −15 volts. At voltages beyond −15 volts, the responsivity begins to fall. In some cases, the responsivity of a photodetector that exhibits a large gain may not be sufficiently linear for certain applications. Hence, in selecting a proper back voltage, in addition to responsivity, other factors, such as the linearity of the response should be considered. In addition, in applications in which the photodetectors are incorporated in an integrated silicon circuit, the bias voltage should be compatible with the requirements of that circuit.

Figure 19A:
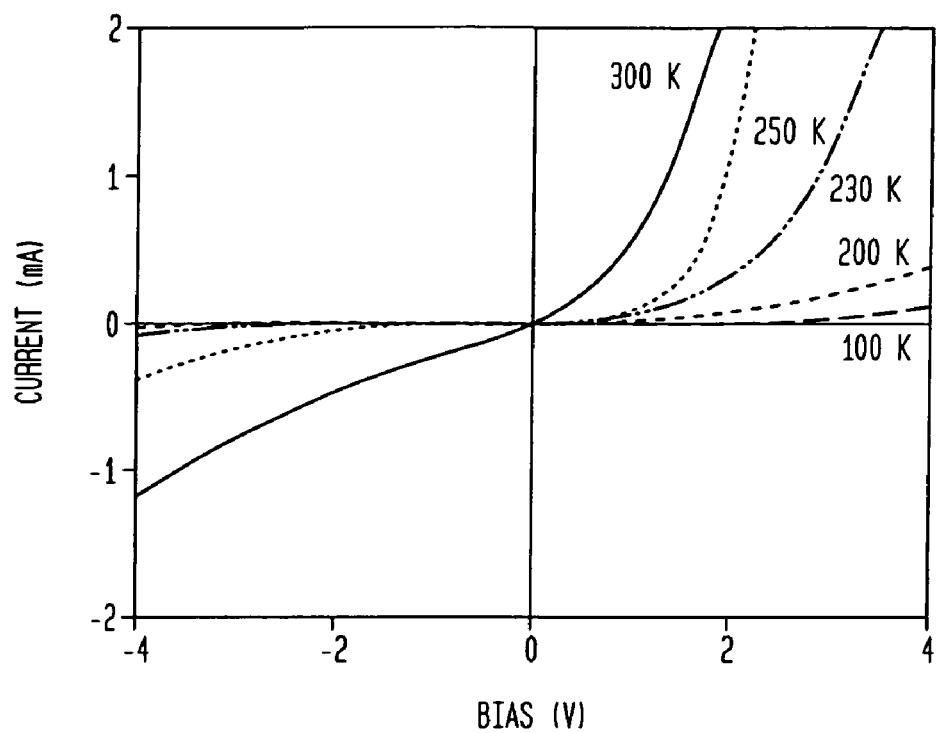
FIG. 19A presents graphs depicting current-voltage characteristics of an n-doped silicon sample microstructuured by femtosecond laser pulses at a fluence of 4 kJ/m$^2$ and annealed at 825 K as a function of operating temperature.
Figure 19B:
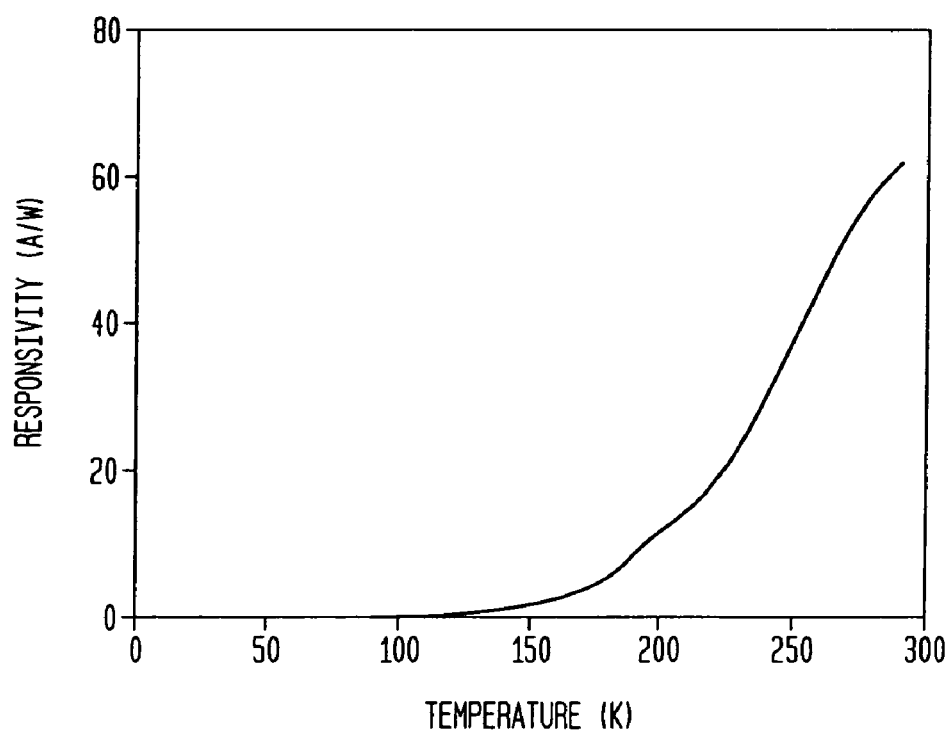
FIG. 19B presents a graph depicting the responsivity of a microstructured silicon wafer to incident radiation having a wavelength of 1064 nm as a function of operating temperature.

A photodetector formed according to the teachings of the invention can operate within a wide range of temperatures. In some cases, it may be advantageous to cool the photodetector to decrease its average noise level. By way of example, FIG. 19A presents current-voltage curves corresponding to an n-doped microstructured silicon sample made with femtosecond pulses at a fluence of about 4 kJ/m$^2$ and annealed at 825 K at different operating temperatures. The measured current in both the back bias and forward bias conditions decreases with decreasing the temperature. At very low temperatures (below 100 K), conduction becomes very low for both forward and back biases. FIG. 19B shows the responsivity of such a microstructured wafer to incident radiation having a wavelength of 1064 nm (a wavelength close to the band gap of silicon at room temperature) at a back bias of −0.5 V as a function of operating temperature. The measured responsivity drops with temperature. This behavior may be, however, different if the wavelength of the illuminating light is far from the silicon band gap. A graph of the dark current at a bias voltage of −0.5 V as a function of temperature, however, shows that the noise decreases much more rapidly that the responsivity.

In sum, photodiodes formed according to the teachings of the invention can exhibit responsivities in a wide region of the electromagnetic spectrum (e.g., wavelengths in a range of about 250 nm to about 1100 nm) that are nearly two orders of magnitude higher than those exhibited by conventional commercial silicon photodiodes. Further, responsivities at longer wavelengths, e.g., as long as 1600 nm, can be nearly five orders of magnitude greater than those exhibited by conventional silicon photodiodes in this range. In some of the above prototype samples fabricated according to the teachings of the invention for illustration purposes, the carrier mobility in the surface layer was measured to be about 101 cm$^2$V$^{-1}$s$^{-1}$; the response times included a rise time of about 10 ns and a fall time of about 30 ns; and a diode capacitance of about 63.9 nF at a back bias of −0.5 V was measured. A photodiode of the invention can exhibit a large gain at very small applied bias voltages, e.g., a gain greater than 1000 for an applied bias voltage of −0.5 V.

A silicon photodetector according to the teachings of the invention, such as the above exemplary photodetector 46 (FIG. 11A), can be fabricated by employing a variety of techniques. By way of example, in one exemplary method of fabricating such a photodetector, a selected portion of a silicon wafer, e.g., a 5×5 mm$^2$ area, is microstructured via exposure to short laser pulses in the presence of a suitable material, e.g., SF$_6$, in a manner described above. The wafer is then dipped in a solution of HF (e.g., a 5% solution) in order to remove any native oxide layer before forming electric contacts with the microstructured layer. Subsequently, a mask is deposited over the surface of the microstructued layer having exposed portions which correspond to a desired pattern of a conductive electrode to be formed on that surface. A selected metal, e.g., a Cr/Au alloy, is then evaporated over the masked surface, and the mask is removed to leave behind a patterned conductive layer, such as the conductive layer 52 shown in FIG. 11A, and uncoated portions suitable for receiving radiation. Further, a conductive layer can be formed on a back surface of the wafer, an unstructured surface opposed to the microstructured layer, such as the layer 54 shown in FIG. 11A. In many embodiments, the entire back surface is coated with the metal. The wafer can be then be coupled to a voltage source, such as the source 56 shown in FIG. 11A, that can apply a bias voltage thereto and optionally other electronic elements, e.g., capacitors, in a manner known in the art. Further, the wafer and its associated circuitry can be placed in an appropriate housing by employing techniques known in the art.

The applications of microstructured silicon wafers formed according to the teachings of the invention, such as those discussed above, are not limited to photodetectors. For example, such silicon wafers can be employed in fabricating solar cells. In some cases, the optimal values of various parameters, such as substrate doping, associated with the microstructured wafer utilized in generating solar cells can be different than those in fabricating silicon photodetectors. A solar cell can be considered a p-n junction photodiode with high quantum efficiency. The conversion of photons into photocarriers is the physical mechanism by which light is converted in a solar cell into electricity. However, there is a fundamental difference between a photodetector and a solar cell. A photodetector is generally operated in a "photoconductive" mode: a back bias is applied thereto and a current is measured. In contrast, a solar cell is operated in a "photovoltaic" mode: it is operated in an open circuit mode or attached to a load without application of a bias voltage.

In one embodiment, a microstructured layer is formed in a p-doped crystalline silicon substrate by initially irradiating a plurality of locations on a surface thereof with femtosecond (e.g., 100 fs, and a central wavelength of 800 nm) laser pulses having a fluence of about 4 kJ/m$^2$ followed by annealing at 1075 K for about one hour. The wafer can then be utilized in fabricating a solar cell. More specifically, metal contacts, e.g., Cr/Au contacts, can be evaporated on the microstructure layer's surface so as to coat selected portions thereof while leaving at least a portion of the surface uncovered for receiving radiation, e.g., a finger grid metallic pattern can be disposed on the surface. In addition, the back surface of the substrate, the unstructured surface opposing the structured surface, can be coated, e.g., via evaporation, with a metallic coating. A load can be attached the wafer via electrical coupling to the metallic layers on the both sides of the wafer.

Figure 20:
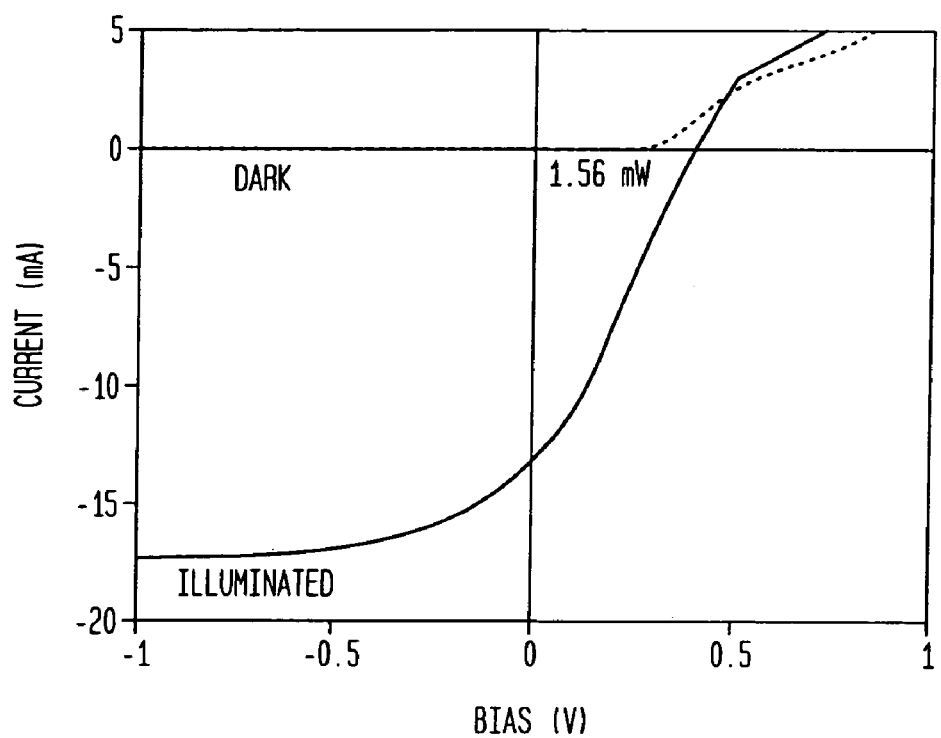
FIG. 20 illustrates current-voltage characteristics for a high resistivity (resistivity greater than 1 Ohm-m) microstructured silicon wafer that can be utilized as a solar cell, with and without one sun illumination.
Figure 21:
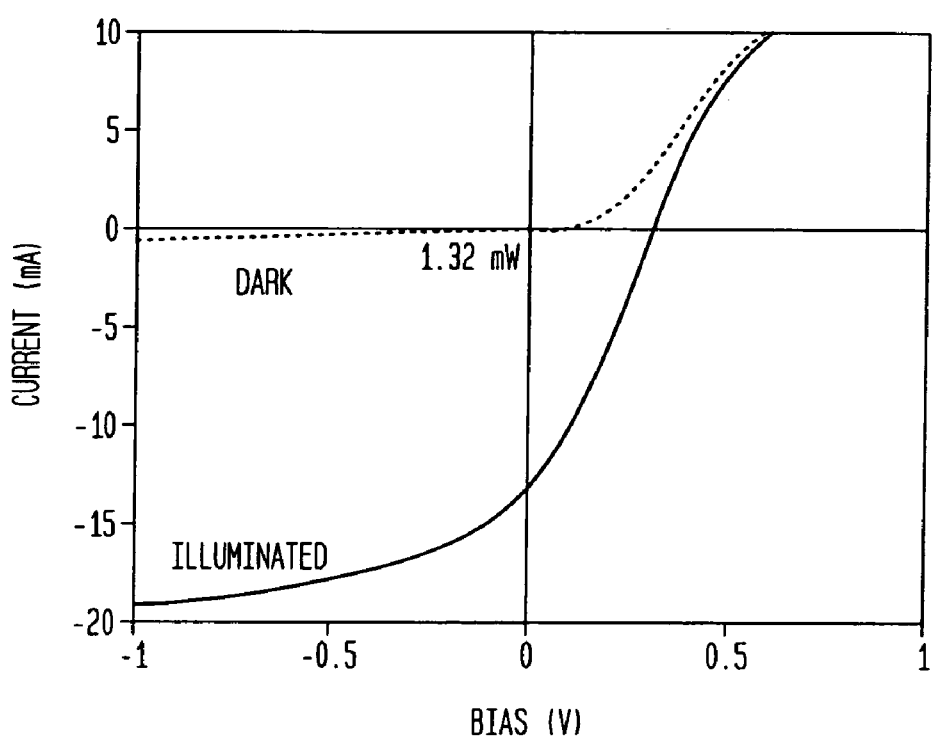
FIG. 21 illustrates current-voltage characteristics for a low resistivity (e.g., a resistivity in a range of about 0.01 to about 0.1 Ohm-m) microstructured silicon wafer that can be utilized as solar, with and without one sun illumination, FIG. 22 schematically depicts an exemplary experimental set-up for measuring field emission of a silicon substrate microstructured in accordance with the teachings of the invention.

FIG. 20 presents data comparing current-voltage (I-V) behavior of such a wafer, formed in a high resistivity (resistivity greater than about 1 ohm-m) silicon substrate, that can be utilized as a solar cell in the presence and in the absence of illumination. And FIG. 21 presents a similar comparative data for a wafer formed in low resistivity silicon substrate (resistivity in a range of about 0.01-0.1 ohm-m). The solar cell fabricated by employing the high resistivity substrate has an open circuit voltage of 0.4 volts and a short circuit current of 13.4 mA while the solar cell fabricated by utilizing the low resistivity substrate has an open circuit voltage of 0.31 volts and a short circuit current of 13.45 mA. It should be understood that this data is presented only for illustration purposes, and to show the possibility of utilizing a wafer microstructured in accordance with the teachings of the invention in forming a solar cell. However, this data is not intended to indicate optimal performance of a solar cell generated in accordance with the teachings of the invention. For example, the deposition of electrical contacts on the substrate can be optimized to obtain better performance than that described above.

Figure 22:
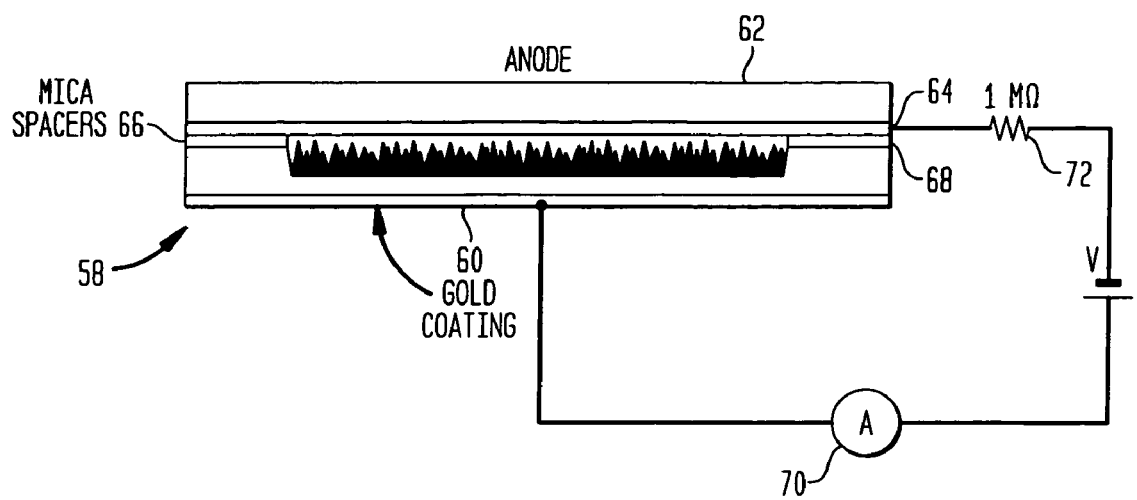

In another application, a silicon wafer microstructured in accordance with the teachings of the invention can be utilized as a field emitter. In other words, an electric field can be applied to the microstructured surface to cause emission of electrons therefrom. To show the possibility of utilizing a microstructured wafer for generating field emission current, a number of prototype exemplary microstructured wafers were fabricated and field emission currents generated by them were measured. The experimental step-up for performing these measurements is shown schematically in FIG. 22. A microstructured silicon sample 58 with a gold coating 60 evaporated on a back surface is mounted to a silicon wafer 62 having a gold coating 64, which functions as an anode, and is separated therefrom by a pair of mica spacers 66 and 68. The mounted sample is placed in a vacuum chamber, which is evacuated to a pressure of about $10^{-6}$ torr. A potential difference can be applied between the microstructured sample 58 and the gold-coated anode. And emission current can be measured at each applied voltage, e.g., via a picoammeter 70, a resistive elements 72 placed in series with the ammeter to protect it from unexpected surges in current.

Figure 23:
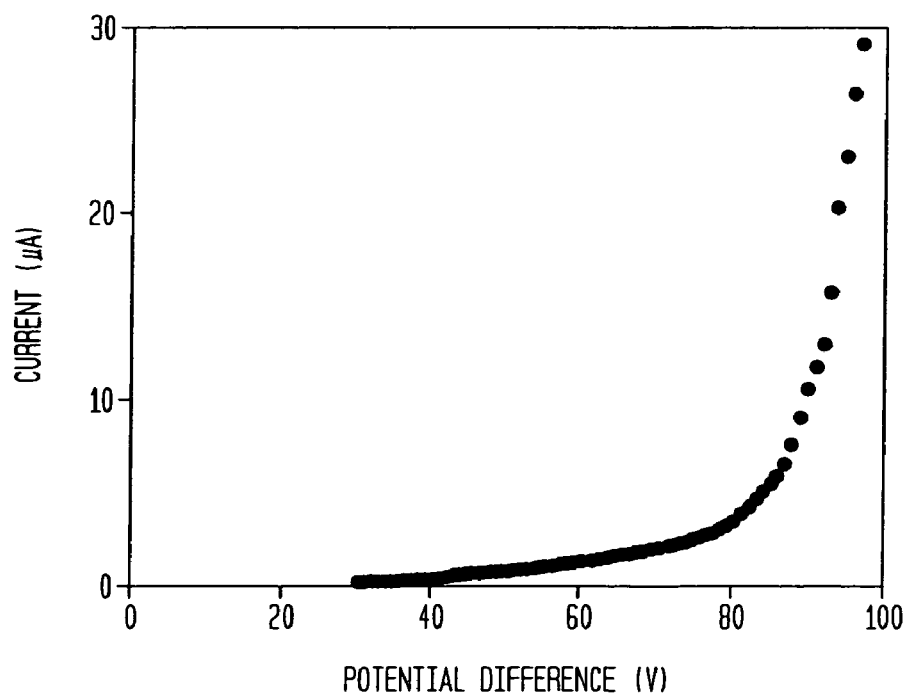
FIG. 23 shows a graph depicting field emission current generated by a silicon wafer microstructured by exposure to femtosecond laser pulses in the presence of SF$_6$ as a function of a potential difference applied thereto.

FIG. 23 shows exemplary results of field emission currents measured for silicon samples microstructured in $SF_6$. The typical figures of merit for a field emitting surface are turn-on-field, defined as the electric field (bias voltage divided by the tip-to-anode spacing) for which a current density of 0.01 microampere/mm$^2$ is observed, and threshold field, defined as the field at which a current density of 0.1 microamperes/mm$^2$ is produced. The turn-on field for a plurality of exemplary prototype substrates microstructured in $SF_6$ was measured as 1.3 V/micrometer, and the threshold field was measured as 2.15 V/micrometer—excellent values that are on par with those exhibited by nanotubes.

Those having ordinary skill in the art will appreciate that various modifications can be made to the above embodiments without departing from the scope of the invention. It should also be understood that various exemplary data presented above are intended only for illustrating salient features of various aspects of the invention, and is not intended to limit the scope of the invention.

What is claimed is:

1. A method of fabricating a radiation-absorbing semiconductor structure, comprising:
    irradiating each of a plurality of locations on a surface of a silicon substrate with one or more femtosecond laser pulses while exposing said surface to a sulfur-containing substance so as to generate a plurality of sulfur inclusions in a surface layer of said substrate, and
    annealing said substrate at a temperature in a range of about 500 K to about 1100 K for a time duration in a range of about a few seconds to about a few hours.

2. The method of claim 1, further comprising selecting a duration of each laser pulse to be in a range of about 50 femtoseconds to about 500 femtoseconds.

3. The method of claim 1, further comprising selecting a fluence of each pulse to be in a range of about 1 kJ/m$^2$ to about 15 kJ/m$^2$.

4. The method of claim 1, further comprising selecting a central wavelength of said laser pulses to be in a range of about 200 nm to about 800 nm.

5. The method of claim 1, wherein said irradiating step comprises exposing each location to a number of laser pulses ranging from 2 to about 500.

6. The method of claim 1, further comprising subjecting each of said surface locations to successive laser pulses separated from one another by a time interval in a range of about 1 microsecond to about 1 millisecond.

7. The method of claim 1, further comprising performing said annealing step in any of an inert atmosphere or a low-pressure atmosphere.

8. The method of claim 1, further comprising selecting said sulfur-containing substance to be any of $SF_6$ and $H_2S$.

9. The method of claim 1, wherein said semiconductor structure absorbs radiation having wavelength components in a range of about 0.25 to about 10 microns.

10. The method of claim 1, wherein said semiconductor structure absorbs radiation having wavelength components in a range of about 0.35 to about 2.5 microns.

11. The method of claim 1, wherein said semiconductor structure exhibits a substantially uniform absorption for wavelength components in a range of about 1.2 to about 2.5 microns.

12. A method of fabricating a photodetector, comprising:
forming a semiconductor structure absorbing radiation in a wavelength range of about 0.25 to about 3.5 microns and exhibiting a diodic current-voltage characteristic in said wavelength range, said forming step comprising:
irradiating a surface of a silicon substrate at one or more locations thereof with one or more laser pulses having short pulse widths while exposing said surface to a sulfur-containing gas to generate a micro-structured layer having sulfur inclusions,
annealing said substrate at a temperature in a range of about 500 K to about 1000 K for a time duration in a range of about a few seconds to about a few hours, and
depositing a plurality of metallic contacts on selected portions of said semiconductor structure to allow applying a reverse bias voltage thereto.

13. The method of claim 12, wherein said pulse widths are selected to be in a range of about tens of femtoseconds to about tens of nanoseconds.

14. The method of claim 12, further comprising selecting said sulfur-containing substance to be any of $SF_6$ and $H_2S$.

15. The method of claim 12, further comprising performing said annealing step in an inert atmosphere.

16. The method of claim 12, wherein said depositing step comprises thermally evaporating one or more selected metals on said selected portions of the semiconductor structure.

17. The method of claim 12, further comprising selecting a thickness of said metal contacts to be in a range of about 5 nm to about 100 nm.

18. The method of claim 16, wherein said depositing step comprises thermally evaporating a chromium layer followed by thermally evaporating a gold layer on a selected portion of said semiconductor structure to generate at least one of said metal contacts.

19. The method of claim 18, further comprising selecting a thickness of said chromium layer to be in a range of about 1 nm to about 5 nm.

20. The method of claim 19, further comprising selecting a thickness of said gold layer to be in a range of about 4 nm to about 100 nm.

21. The method of claim 12, further comprising configuring said metal contacts so as to ensure that at least a portion of said micro-structured layer remains capable of receiving an external radiation.

22. A method of fabricating a semiconductor structure, comprising
irradiating a plurality of locations on a surface of a silicon substrate with one or more laser pulses having pulse widths in a range of about 50 to about 500 femtoseconds while exposing said surface to a substance having an electron-donating constituent so as to generate a micro-structured surface layer comprising inclusions incorporating said electron-donating constituent, and
annealing said substrate at an elevated temperature in a range of about 500 K to about 1100 K for a selected time period.

23. The method of claim 22, further comprising selecting said electron-donating constituent to be any of chlorine ($Cl_2$), nitrogen ($N_2$) and air.

24. The method of claim 22, wherein said irradiating step further comprises directing said laser pulses at said surface along a direction substantially perpendicular to said surface.

25. The method of claim 22, wherein said selected annealing period is in a range of about a few seconds to about a few hours.

26. The method of claim 22, wherein said annealing step is performed in an inert atmosphere.

27. A method of fabricating a radiation-absorbing semiconductor wafer, comprising:
irradiating at least one surface location of a silicon substrate with a plurality of temporally short laser pulses while exposing said location to a substance having an electron-donating constituent so as to generate a substantially disordered surface layer incorporating a concentration of said electron-donating constituent, and
annealing said substrate at an elevated temperature and for a duration selected to enhance charge carrier density in said substantially disordered surface layer.

28. The method of claim 27, wherein said elevated temperature and duration are selected to cause re-arrangement of atomic bonds in said surface layer so as to increase concentration of carrier electrons in surface layer.

29. The method of claim 27, wherein said elevated temperature and duration are selected to enhance electron carrier density in the surface layer by a factor of about 10% to about 200% relative to a pre-annealing level.

30. The method of claim 27, wherein said elevated temperature and duration are selected to cause said surface layer to form a diode junction with underlying silicon substrate.

31. The method of claim 27, wherein said elevated temperature and duration are selected such that said annealed substrate exhibits a responsivity in a range of about 1 A/W to about 200 A/W upon exposure of said surface layer to radiation having wavelengths in a range of about 250 nm to about 1100 nm and application of a reverse bias in a range of about 0.1 V to about 15 V to said wafer.

32. The method of claim 27, wherein said elevated temperature is selected to be in a range of about 500 K to about 1100 K.

33. The method of claim 32, wherein said duration is selected to be in a range of about a few seconds to about few hours.

34. The method of claim 27, further comprising selecting said short laser pulses to have pulse widths in a range of about tens of femtoseconds to about tens of nanoseconds.

35. The method of claim 27, further comprising selecting a fluence of said pulses and a partial pressure of said substance having an electron-donating constituent such that the concentration of said electron-donating constituent incorporated in said surface layer ranges from about 0.5 to about 5 atom percent.

36. A method of enhancing responsivity of a radiation-absorbing semiconductor wafer to incident radiation, comprising
irradiating at least one surface location of a silicon substrate with temporally short laser pulses while exposing the substrate to a substance having an electron-donating constituent so as to generate a microstructured surface layer having inclusions containing the electron-donating constituent, and annealing the substrate at an elevated temperature and for a duration selected to enhance a responsivity of the microstructured substrate to radiation having at least one wavelength in a range of about 250 nm to about 1100 nm incident on the microstructured surface layer by at least a factor of about 10.

37. The method of claim 36, wherein the annealing temperature lies in a range of about 700 K to about 900 K.

* * * * *